United States Patent
Matsumoto et al.

(10) Patent No.: US 8,479,338 B2
(45) Date of Patent: Jul. 9, 2013

(54) CLEANING DEVICE

(75) Inventors: Hideki Matsumoto, Kobe (JP); Masashi Ohta, Kobe (JP)

(73) Assignee: Bando Kagaku Kabushiki Kaisha, Kobe-Shi (JP)

( * ) Notice: Subject to any disclaimer, the term of this patent is extended or adjusted under 35 U.S.C. 154(b) by 0 days.

(21) Appl. No.: 13/577,606

(22) PCT Filed: Feb. 14, 2011

(86) PCT No.: PCT/JP2011/000802
§ 371 (c)(1),
(2), (4) Date: Aug. 7, 2012

(87) PCT Pub. No.: WO2011/099307
PCT Pub. Date: Aug. 18, 2011

(65) Prior Publication Data
US 2012/0304404 A1   Dec. 6, 2012

(30) Foreign Application Priority Data
Feb. 15, 2010   (JP) .................................. 2010-030401

(51) Int. Cl.
*B08B 6/00*       (2006.01)
(52) U.S. Cl.
USPC .......................................................... 15/1.51
(58) Field of Classification Search
USPC .................. 15/1.51, 102, 100, 88.2–88.3, 77
See application file for complete search history.

(56) References Cited

U.S. PATENT DOCUMENTS
4,469,435 A * 9/1984 Nosaki et al. ................ 399/148

FOREIGN PATENT DOCUMENTS
| JP | 08203851 A | 8/1996 |
| JP | 2003225625 A | 8/2003 |
| JP | 2008-168188 A | * 7/2008 |
| WO | WO 2010/109755 | * 9/2010 |

OTHER PUBLICATIONS
International Preliminary Report on Patentability for International Application No. PCT/JP2011/000802, dated Sep. 27, 2012.

* cited by examiner

*Primary Examiner* — Laura C Guidotti
(74) *Attorney, Agent, or Firm* — Marshall, Gerstein & Borun LLP

(57) ABSTRACT

Provided is a cleaning device having a compact structure. A recovery unit (17) is configured such that dust collection boxes (76, 77) are disposed with respect to a cleaning brush (6) and a metallic roller (7), respectively. A cleaning blade (9) is fixed to a blade holder (79) via a bolt (78). When the recovery unit (17) is incorporated in a frame unit, the recovery unit (17) is moved in a predetermined direction so as to be brought into contact with a positioning section (14Bbb) of a side plate 14B of the frame unit (11). When the recovery unit (17) is moved, a fixing bolt (85) is loosened so that a straight portion (86a) of a fixed washer (86) is aligned with the vertical direction, and then, the fixing bolt (85) is tightened so that the recovery unit is fixed. On the other hand, when the recovery unit (17) is fixed, the fixing bolt (85) is loosened so that the straight portion of the fixed washer (86) is aligned with the horizontal direction, and then, the fixing bolt is tightened so that the recovery unit is fixed.

20 Claims, 23 Drawing Sheets

CLEANING DEVICE

TECHNICAL FIELD

The present invention relates to a cleaning device for removing foreign matter (dust or the like) adhering onto a surface of a member to be cleaned by an electrostatic force. In particular, the present invention is suitable for a case where a member to be cleaned has a relatively high surface smoothness, such as a glass substrate, a printed board (e.g., a PCB or a PCBA), a film, a sheet, or a plastic plate.

BACKGROUND ART

A cleaning device configured to use an adhesive roller and utilize its adhesive force so as to remove foreign matter such as dust adhering onto a surface of a thin member to be cleaned such as a glass substrate for a flat panel display (FPD), a printed board, or a bonded film has been conventionally known as a cleaning device for removing the foreign matter.

Such an adhesive roller cannot remove minute foreign matter (such as foreign matter having an average diameter of 1 μm or less). Moreover, it is difficult to completely remove foreign matter such as dust that has once adhered onto a surface of the adhesive roller (an adhesive layer), thereby degrading maintenance performance. Additionally, since the adhesive roller is pressed against a member to be cleaned under a certain pressure so as to remove the foreign matter, when the member to be cleaned is, for example, a film, there is a fear that not only the foreign matter but also the film is possibly stuck onto the surface of the roller.

In view of the above, the applicant filed another patent application based on the findings that in removing foreign matter such as dust from a member to be cleaned by using electrophotography, electric charges capable of electrostatically adsorbing the foreign matter are electrically charged onto a surface of a cleaning roller by peeling charging (or contact charging), so that the foreign matter can be removed by the cleaning roller by utilizing the electrostatic force (refer to Japanese Patent Application No. 2008-271797).

The foreign matter is sequentially accumulated on the surface of the above-described cleaning roller, and therefore, maintenance work need be periodically performed to remove the foreign matter from the surface of the cleaning roller. Hence, the applicant had filed before patent applications about a cleaning system provided with a transfer roller or a charging control roller with respect to the cleaning roller so as to stably continue adsorbing and removing operations for the foreign matter by the cleaning roller for a long period of time without periodically performing such maintenance work (refer to Japanese Patent Application Nos. 2009-069972, 2009-138107, and 2009-138108).

The cleaning systems according to the patent applications are provided with a cleaning brush, a metallic roller, a cleaning blade, and the like, so as to remove foreign matter adsorbed onto the transfer roller and maintain the function of the transfer roller for a long period of time.

PRIOR ART DOCUMENT

Patent Document

Patent Document 1: JP 2008-168188 A (paragraph 0014)

SUMMARY OF THE INVENTION

Problems to be Solved by the Invention

In the above-described manner, the cleaning brush, the metallic roller, the cleaning blade, and the like are provided in addition to the cleaning roller, the transfer roller, and the charging control roller, and therefore, there is a demand for integrating the cleaning brush, the metallic roller, the cleaning blade, and the like in a compact manner as possible.

An object of the present invention is to provide a cleaning device having a compact structure.

Solutions to the Problems

According to the invention, a cleaning device includes: a cleaning roller that is rotated in contact with a surface of a member to be cleaned while being relatively moved; a transfer roller that is rotated in contact with the surface of the cleaning roller; and a charging control roller that is rotated in contact with the surface of the transfer roller; the cleaning device, by electric charges to be electrically charged to the charging control roller, changing electric charges for adsorbing foreign matter adhering onto the surface of the member to be cleaned by an electrostatic force with respect to the cleaning roller and the transfer roller, removing the foreign matter such as dust adhering onto the surface of the member to be cleaned by the use of the cleaning roller by utilizing the electrostatic force, and removing the foreign matter adhering onto the cleaning roller by the use of the transfer roller, wherein a recovery unit for removing and recovering the foreign matter adhering onto the transfer roller is detachably attached to a frame unit including the cleaning roller, the transfer roller, and the charging control roller, the recovery unit including a cleaning brush for removing the foreign matter adhering onto the transfer roller, a metallic roller for removing the foreign matter from the cleaning brush, and a cleaning blade for scraping the foreign matter adhering onto the surface of the metallic roller in a predetermined positional relationship with the recovery frame in the state in which the recovery unit is attached to the frame unit.

In this manner, the recovery unit that includes the cleaning brush, the metallic roller, and the cleaning blade and removes and recovers the foreign matter adhering onto the transfer roller can be constituted in an integral manner, thereby achieving a layout advantageous to aiming at compactness and facilitating the attachment and detachment of the recovery unit to and from the frame unit.

In this case, the recovery unit may include a foreign matter containing box, in which the foreign matter scraped by the cleaning brush and the cleaning blade is contained.

It is desirable that the recovery frame should be configured to rotatably support the cleaning brush and the metallic roller between right and left side plates, the metallic roller and the cleaning brush should be provided at the ends of rotary shafts thereof with electrodes exposed outside of the side plates of the recovery frame, and a containing groove that contains therein an electric wire to be connected to the electrode should be formed at an outside surface of the side plate of the recovery frame.

In this manner, when the recovery unit is attached to or detached from the unit frame, the electric wire can be prevented from interfering.

It is desirable that the frame unit should be provided with a fixed washer capable of locking the recovery unit with respect to the frame unit, the fixed washer selectively taking a first position where the recovery unit can be detachably attached to the frame unit and a second position where the recovery unit is prohibited from being detachably attached to the frame unit but is locked to the frame unit.

In this manner, the recovery unit can be securely locked to the frame unit without interfering the attachment or detachment of the recovery unit to or from the frame unit.

It is desirable that the cleaning roller, the transfer roller, and the charging control roller should be rotatably supported by a roller frame, thus configuring a roller unit, the roller unit being detachably attached to the frame unit.

In this manner, the cleaning roller, the transfer roller, and the charging control roller are integrated into a unit, thereby achieving compactness and facilitating the attachment to or detachment from the frame unit.

It is desirable that the cleaning roller, the transfer roller, and the charging control roller should be incorporated to the roller frame with reference to the rotary shaft of the transfer roller.

In this manner, the cleaning roller and the charging control roller can be accurately incorporated with respect to the roller frame with reference to the rotary shaft of the transfer roller.

The cleaning roller is rotatably supported by a first slide block whereas the charging control roller is rotatably supported by a second slide block, the roller frame rotatably supports the transfer roller, and further, has first and second fitting grooves, to which the first and second slide blocks are slidably fitted, and the roller unit is provided with first and second spring members for urging the first and second slide blocks in a direction in which the transfer roller and the charging control roller are pressed against the transfer roller in the state in which the first and second slide blocks are fitted to the first and second fitting grooves.

In this manner, the cleaning roller and the charging control roller can be accurately incorporated with respect to the roller frame with reference to the transfer roller.

The roller frame is configured to rotatably support the cleaning roller, the transfer roller, and the metallic charging control roller between the right and left side plates, a tapered shaft is rotatably and slidably interposed between the right and left side plates, the tip of the tapered shaft being configured to be resiliently urged so as to project toward the center of the frame unit, and a tapered hole, to which the tapered shaft is fitted, is formed between the right and left side plates in the roller frame.

In this manner, the roller unit can be readily attached or detached, and further, can be securely incorporated.

It is desirable that a spring member for resiliently urging the roller frame so as to generate a pressing force of the cleaning roller with respect to the member to be cleaned should be interposed between the frame unit and the roller frame.

In this manner, the pressing force of the cleaning roller against the member to be cleaned can be generated by utilizing the roller frame.

It is desirable that the cleaning roller and the charging control roller should be provided at the ends of the rotary shafts thereof with roller electrodes exposed outside of the side plate of the roller frame, and a containing groove that contains therein an electric wire to be connected to the roller electrode should be formed at the outside surface of the side plate of the roller frame.

In this manner, when the roller unit is incorporated, the electric wire can be avoided from interfering.

Effects of the Invention

As described above, the present invention achieves the structure in which the cleaning brush, the metallic roller, and the cleaning blade are integrated into the recovery unit for removing and recovering foreign matter adhering onto the transfer roller, thus achieving a layout advantageous to aiming at compactness and facilitating the attachment and detachment of the recovery unit to and from the frame unit.

EMBODIMENTS OF THE INVENTION

An embodiment according to the present invention will be described with reference to the drawings.

Figure 1:
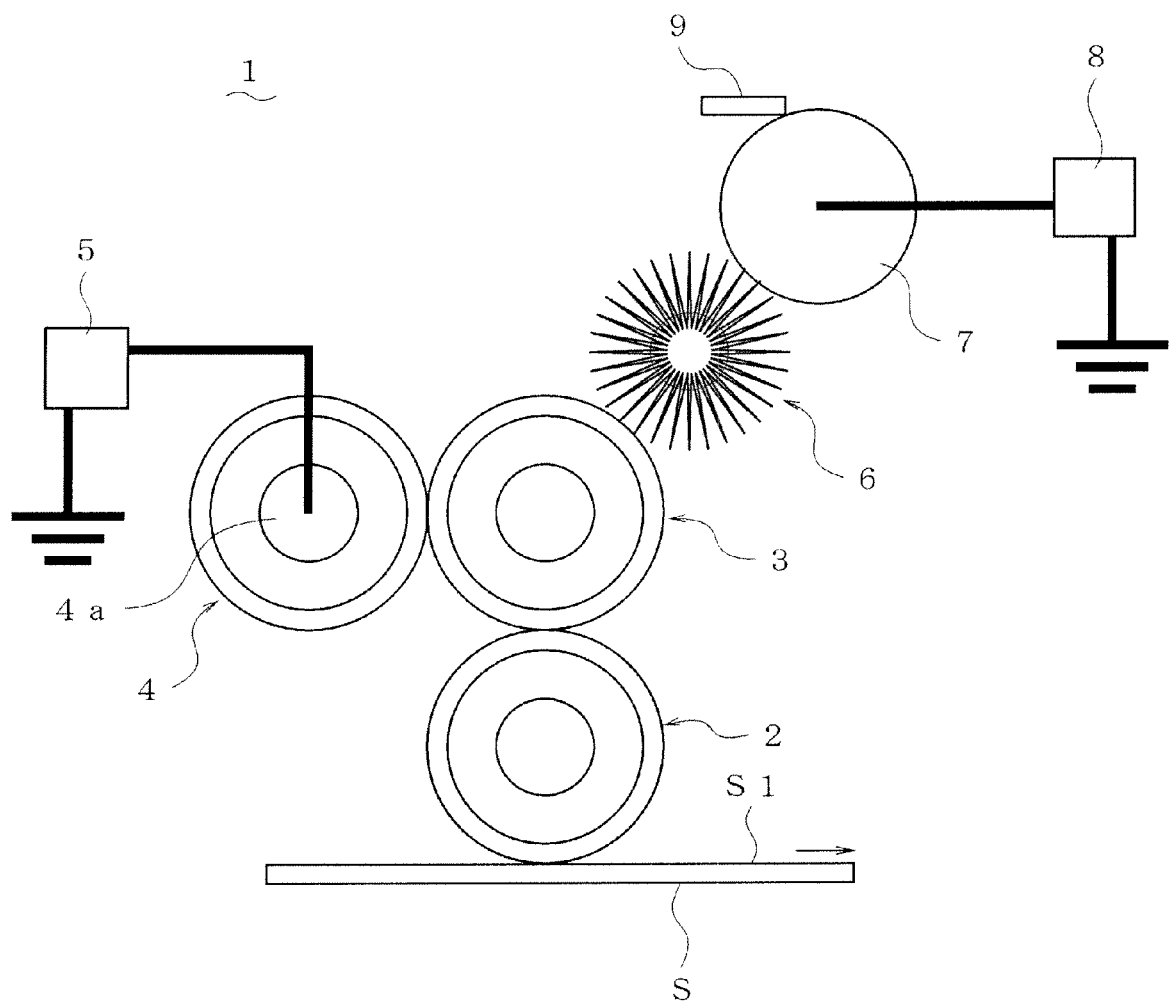
FIG. 1 is an explanatory view of a layout of constituent elements constituting a cleaning device according to the present invention.

A cleaning device according to the present invention is adapted that a cleaning roller is rotated, contacting the surface of the cleaning roller with the surface of a member to be cleaned, while being relatively moved with respect to the member to be cleaned so as to remove foreign matter (e.g., a conductor or a dielectric) such as dust adhering onto the surface of the member to be cleaned by the use of the cleaning roller by utilizing an electrostatic force. In a layout of constituent elements constituting a cleaning device 1, as shown in FIG. 1, a transfer roller 3 that is rotated in contact with the surface of a cleaning roller 2 is disposed with respect to the cleaning roller 2, and a charging control roller 4 that is rotated in contact with the surface of the transfer roller 3 is disposed with respect to the transfer roller 3.

The charging control roller 4 is connected at an iron core 4a thereof to a first outside power source 5. Therefore, electric charges for adsorbing foreign matter adhering onto a surface S1 of a member to be cleaned S by utilizing an electrostatic force can be varied with respect to the cleaning roller 2 and the transfer roller 3. The cleaning roller 2 can be electrically charged with the electric charges for adsorbing the foreign matter adhering onto the surface S1 of the member to be cleaned S by utilizing the electrostatic force. The transfer roller 3 is made of a material whose surface can be electrically charged with the electric charges for adsorbing the foreign matter adhering onto the surface of the cleaning roller 2 by the electrostatic force. The transfer roller 3 is rotated in contact with the surface of the cleaning roller 2, thereby generating a difference in potential between the cleaning roller 2 and the transfer roller 3 according to a difference in surface characteristics between the cleaning roller 2 and the transfer roller 3.

A cleaning brush 6 that is rotated in a direction reverse to that of the transfer roller 3 is provided with respect to the transfer roller 3. A metallic roller 7 is disposed with respect to the cleaning brush 6 in such a manner as to be rotated in the same direction. To the metallic roller 7 is connected a second outside power source 8. In the vicinity of the surface of the metallic roller 8 is located a cleaning blade 9 whose tip scraper scrapes the foreign matter adhering onto the surface of the metallic roller 8. For example, the first outside power source 5 is configured to apply, to the charging control roller 4, a voltage having a large absolute value in a sign reverse to that of the electric charges electrically charged onto the surface of the transfer roller 3 during a transfer operation by the transfer roller 3 except during the cleaning by the cleaning roller 2. In contrast, the second outside power source 8 is configured to apply, to the metallic roller 8, a potential having the same sign as that of the electric charges to be electrically charged onto the surface of the transfer roller 3 during the cleaning operation in such a manner as to generate a difference in potential between the charging control roller 4 and the transfer roller 3.

Next, a description will be given of a specific structure of the cleaning device 1.

Figure 2:
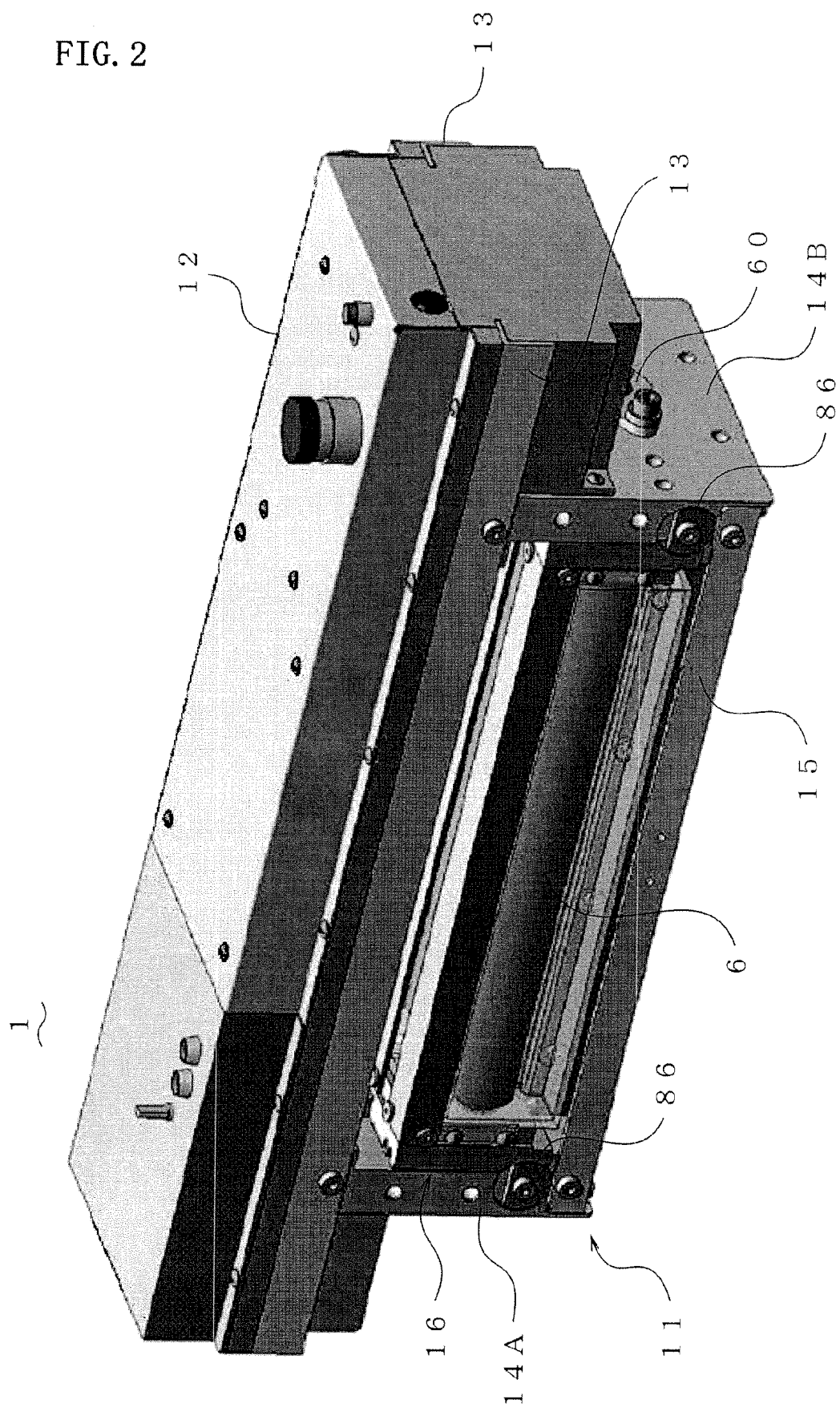
FIG. 2 is a perspective view showing the cleaning device according to an embodiment of the present invention, as viewed from above.
Figure 3:
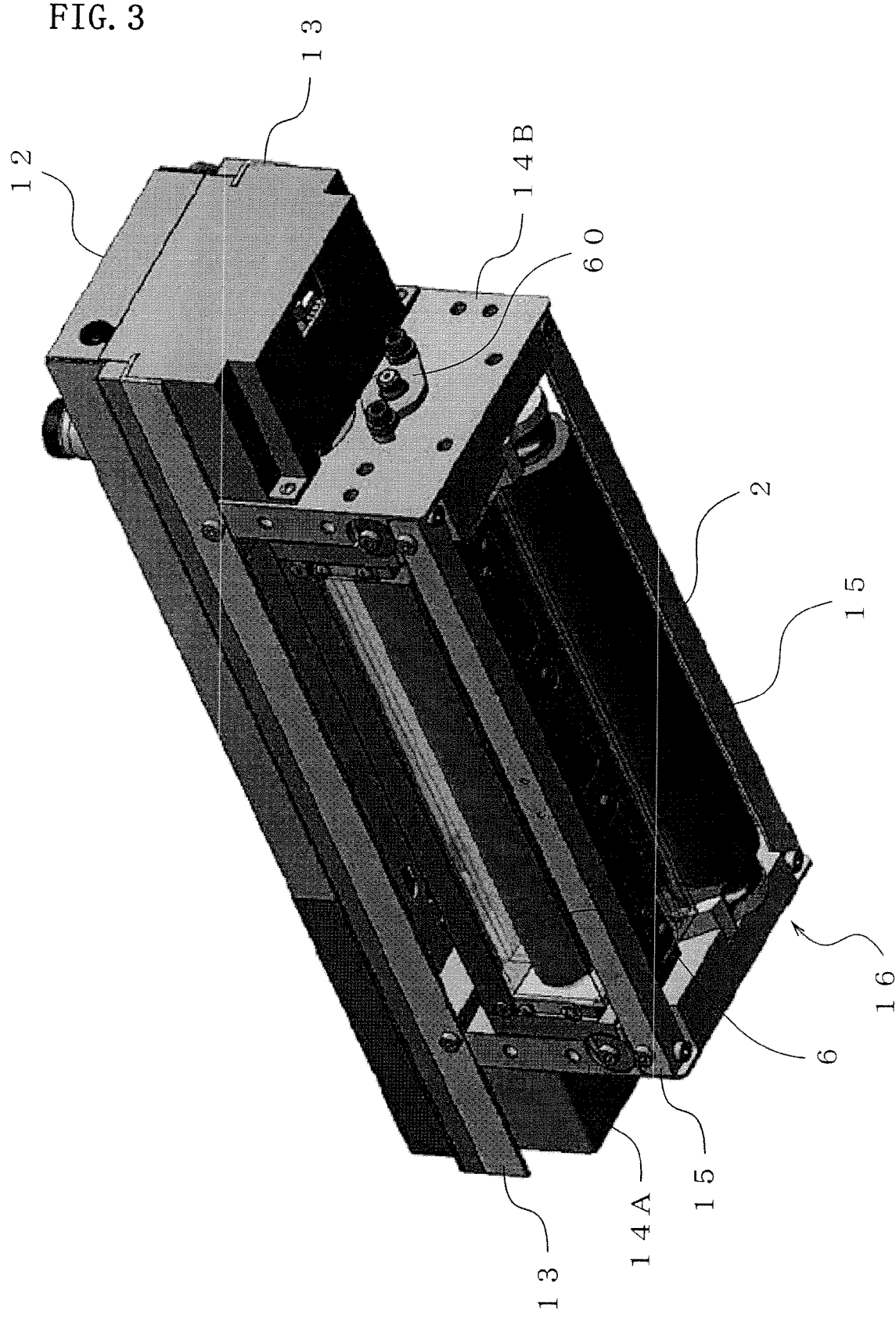
FIG. 3 is a perspective view showing the cleaning device, as viewed from below.
Figure 4:
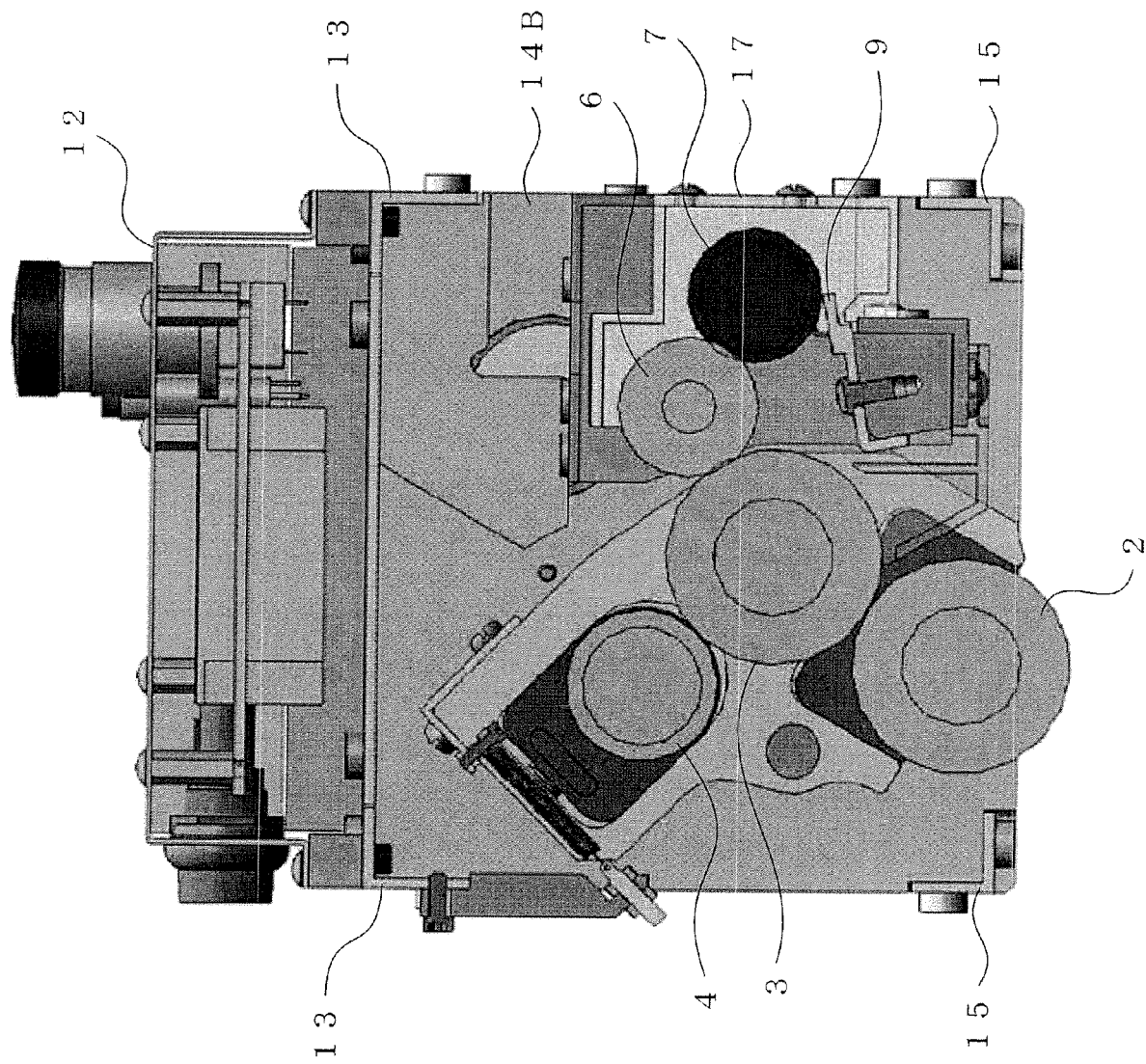
FIG. 4 is a cross-sectional view showing the cleaning device.

As shown in FIGS. 2 to 4, in a frame unit 11, right and left side plates 14A and 14B formed into a rectangular plate shape are disposed with a predetermined interval therebetween via upper reinforcing angles 13 and 13 under an upper unit 12, and the lower portions of the right and left side plates 14A and 14B are connected to each other via lower reinforcing angles 15 and 15.

A roller unit 16 for rotatably supporting the cleaning roller 2, the transfer roller 3, and the charging control roller 4 is inserted from below between the side plates 14A and 14B in the frame unit 11, and further, is detachably attached in a fitting relationship between tapered holes 22Ae and 22Be and tapered shafts 51 and 61, as described later. Moreover, a recovery unit 17 for rotatably supporting the cleaning brush 6, the metallic roller 7, and the cleaning blade 9 is inserted sideways, and further, is securely fixed by using a fixed washer 86, as described later.

Figure 5:
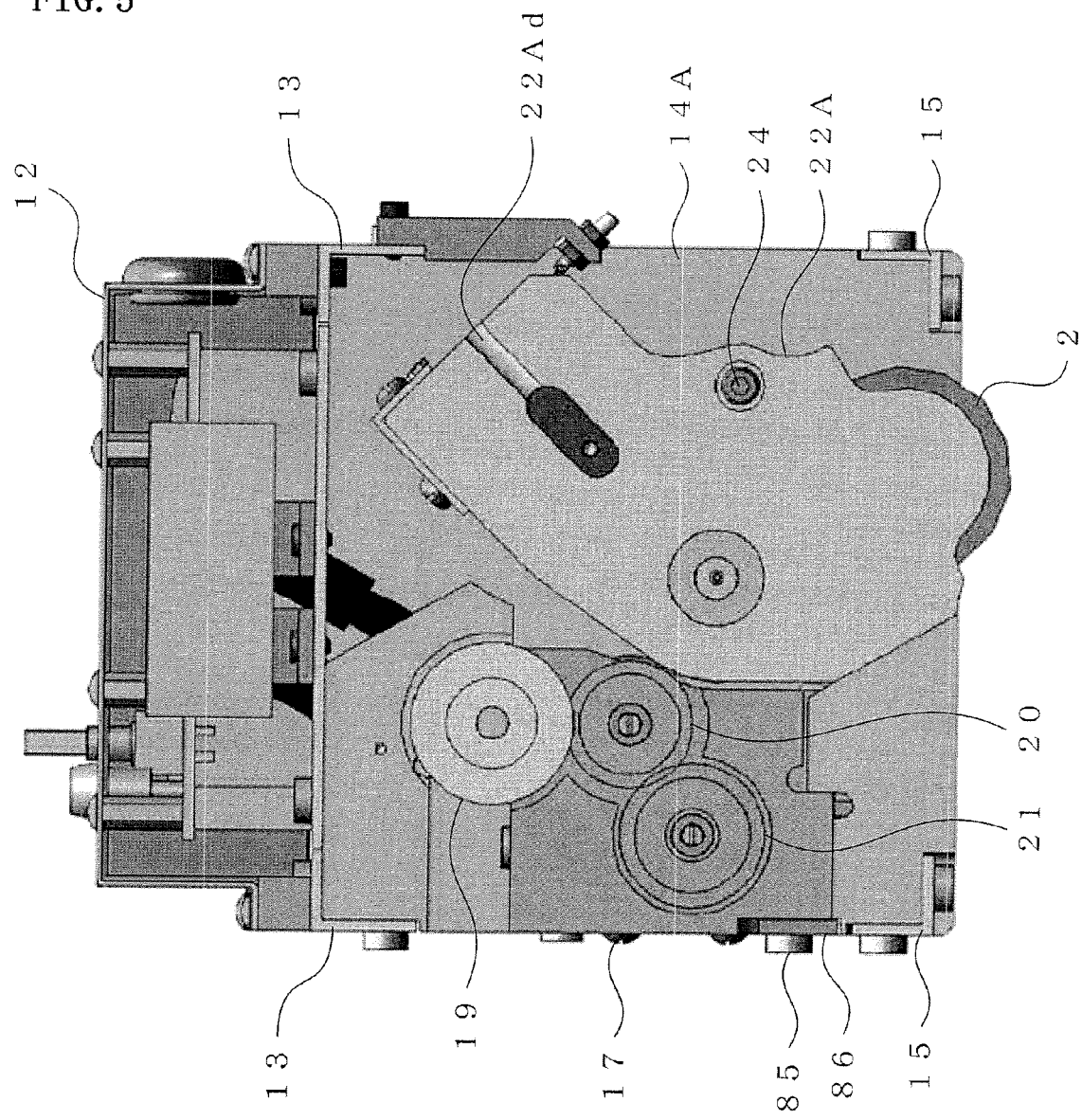
FIG. 5 is a cross-sectional view showing the cleaning device, as viewed at another position.
Figure 6:
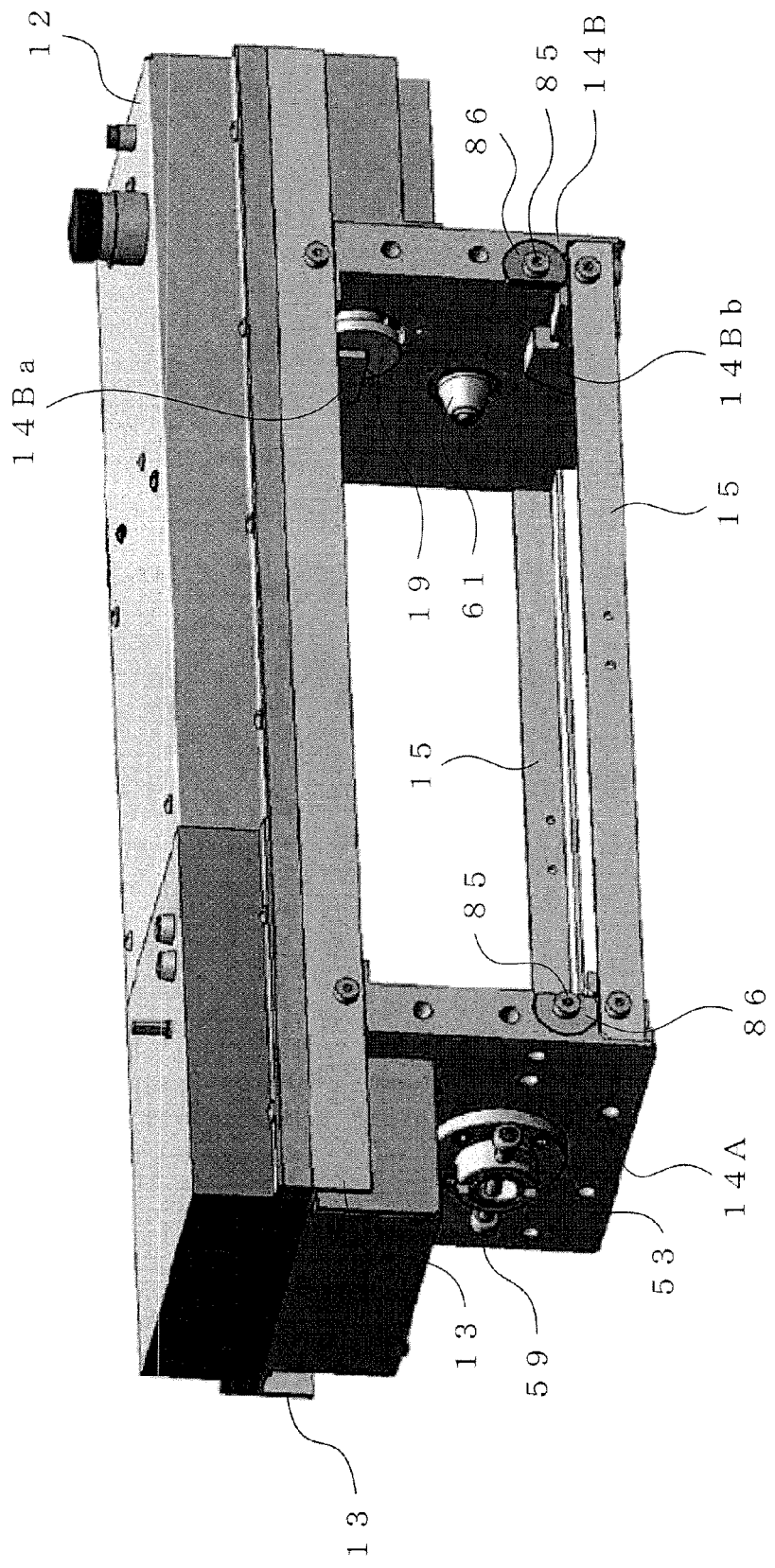
FIG. 6 is a perspective view showing a frame unit.
Figure 7:
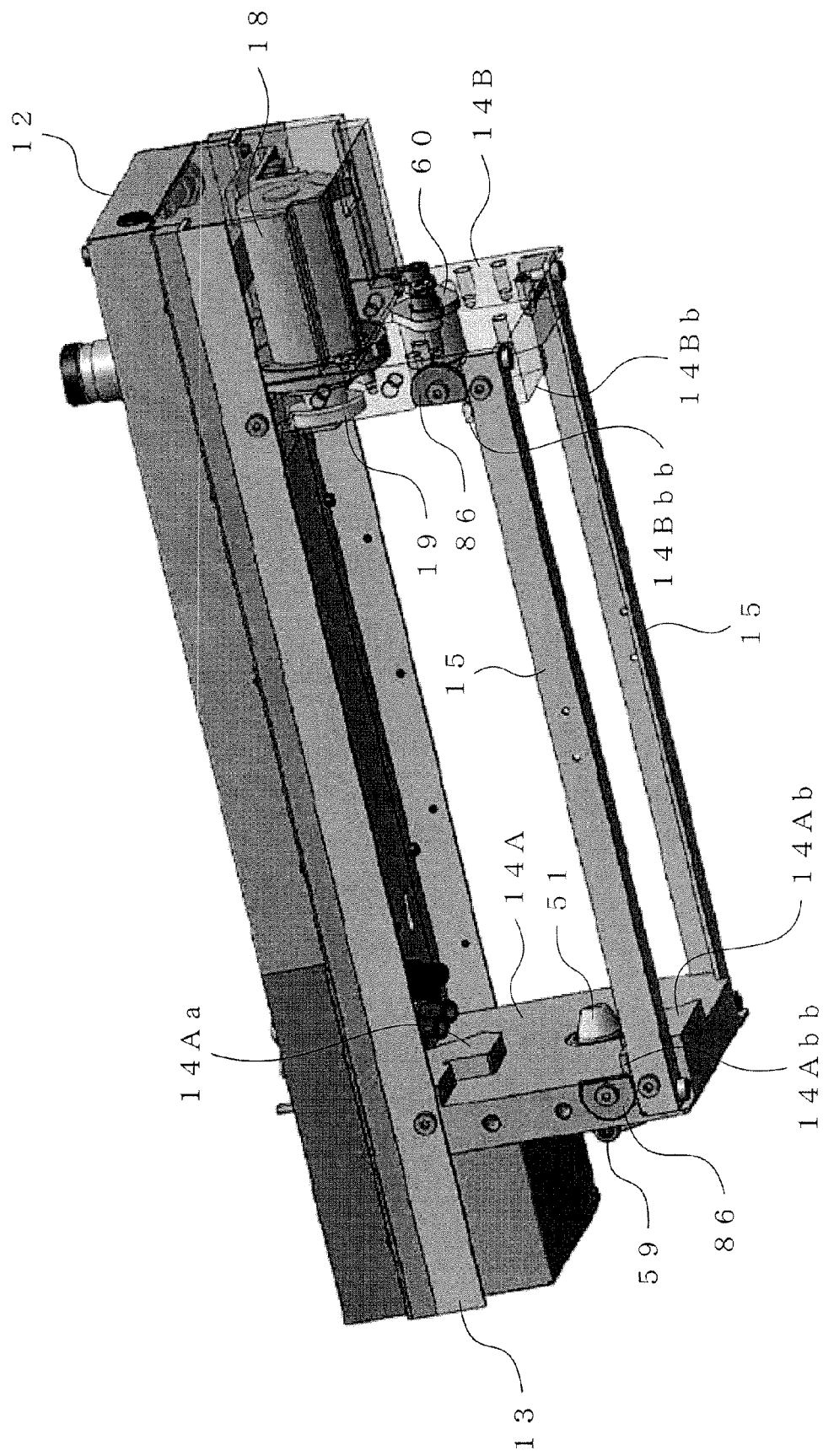
FIG. 7 is a perspective view showing the frame unit, as viewed from below.

Additionally, as shown in FIGS. 5 to 7, a motor 18 is fixed at the outside surface of one side plate 14B in the frame unit 11 in such a manner that a motor shaft projects toward the center. A motor gear 19 to be rotatably driven by the motor shaft of the motor 18 is positioned inside of the side plate 14B.

In the state in which the recovery unit 17 is incorporated, the motor gear 19 and a brush gear 20 for the cleaning brush 6 are vertically aligned with each other such that an error of an inter-shaft distance hardly occurs by determining the fixed position of the recovery unit 17 that is horizontally inserted and withdrawn. A gear 21 for the metallic roller 7 meshes with the brush gear 20.

Figure 8:
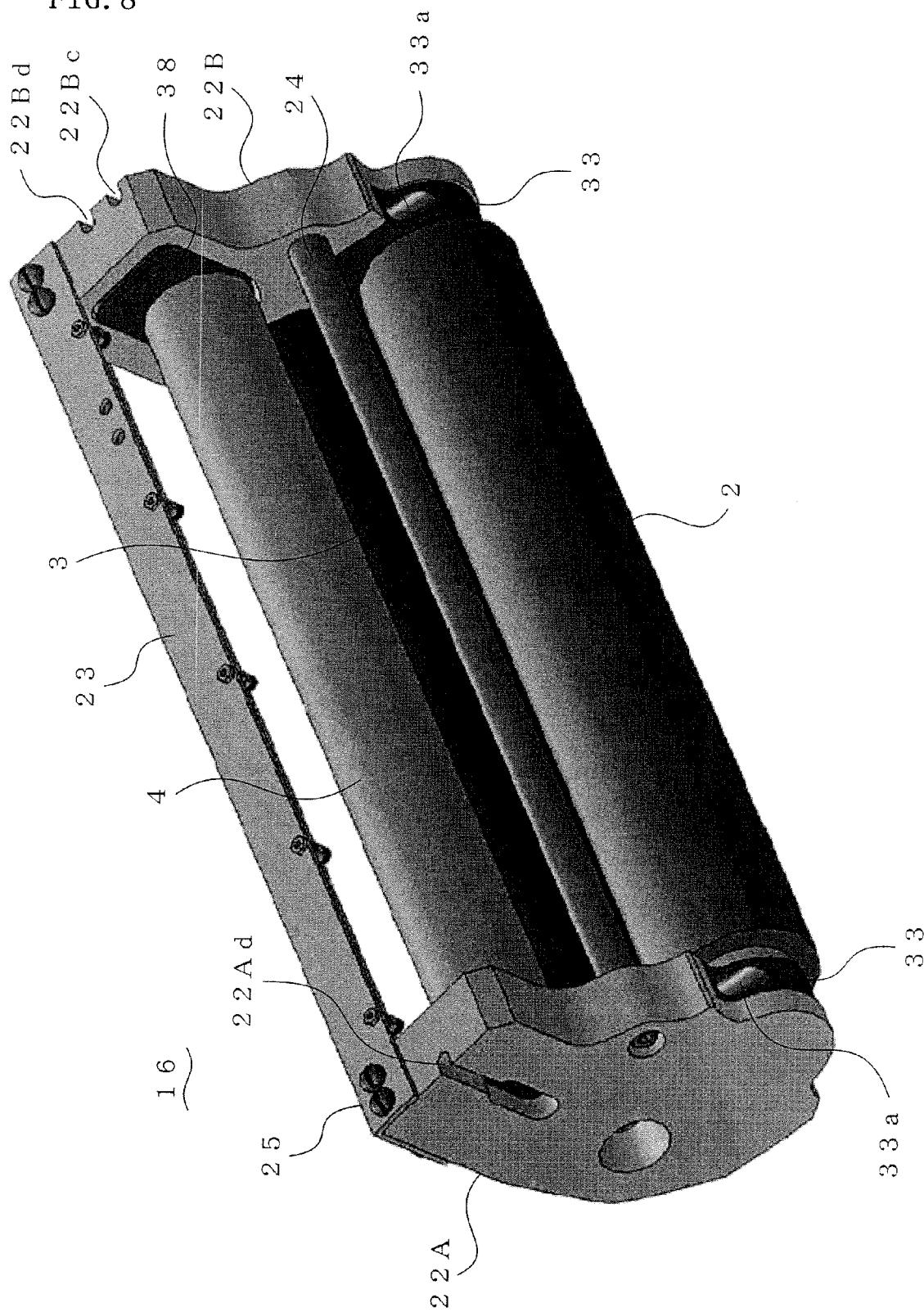
FIG. 8 is a perspective view showing a roller unit, as viewed from above.
Figure 9:
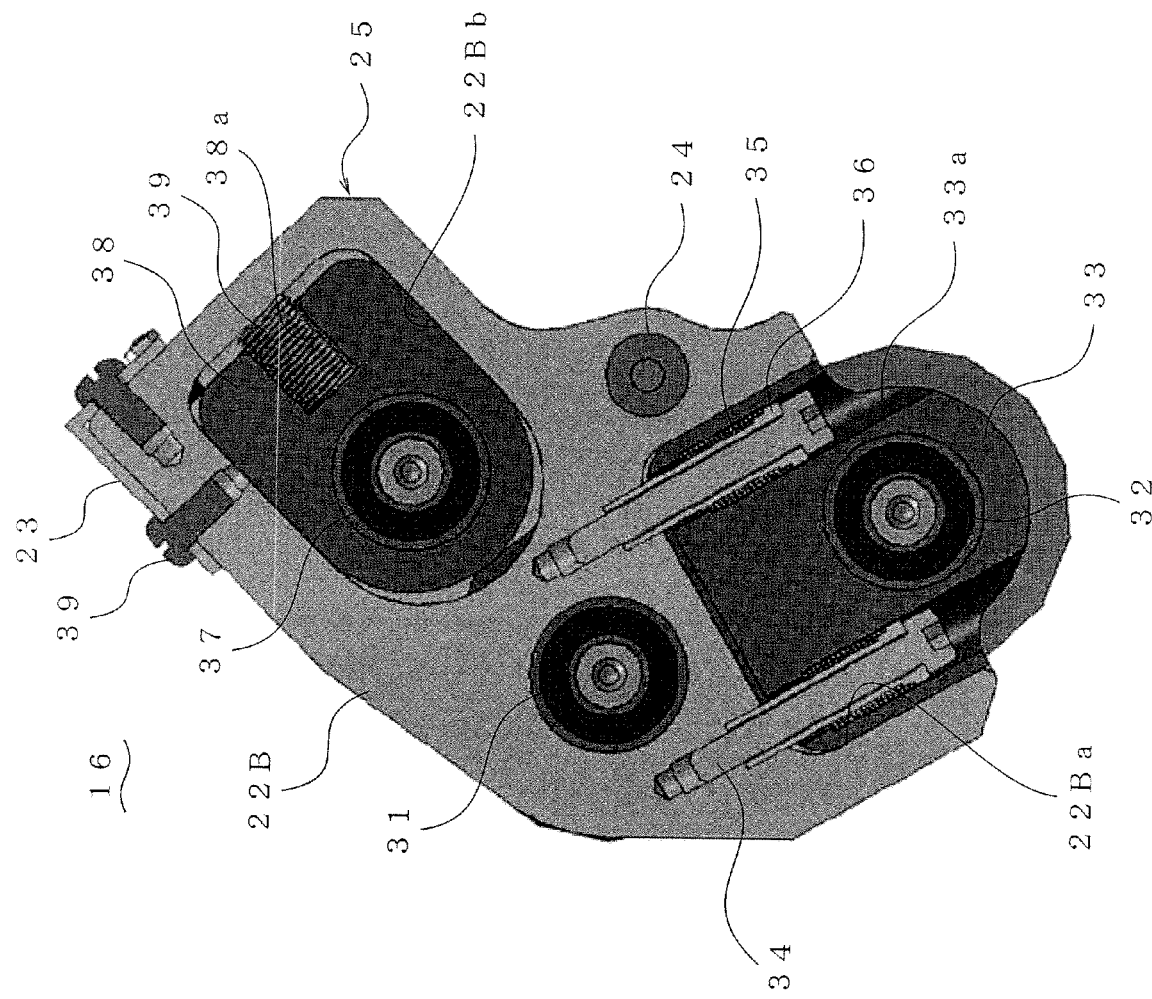
FIG. 9 is a cross-sectional view showing the roller unit.

As shown in FIGS. 8 and 9, in the roller unit 16, a reinforcing angle 23 and a strut 24 are stretched between the two side plates 22A and 22B, and further, a roller frame 25 is provided for rotatably supporting the cleaning roller 2, the transfer roller 3, and the charging control roller 4.

In the roller unit 16, a rotary shaft for the transfer roller 3 is rotatably supported between the side plates 22A and 22B via a bearing 31. A rotary shaft for the cleaning roller 2 is rotatably supported between a pair of first slide blocks via bearings 32 and 32. One first slide block 33 is slidably fitted into a first fitting groove 22Ba formed at the side plate 22B (the roller frame 25), and then, is fixed by a pair of fixing bolts 34 in the fitted state. In addition, a stepped hole 33a is formed at the first slide block 33. A compression spring 35 is fixed at one end thereof to the stepped hole 33a whereas at the other end thereof to a spring guide 36 fixed via the fixing bolt 34. Incidentally, the spring guide 36 and the fixing bolt 34 are configured to penetrate the stepped hole 33a formed at the slide block 33. The compression spring 35 is compressively fixed, so that the first slide block 33 is designed to press the transfer roller 3 against the cleaning roller 2 all the time.

A rotary shaft for the charging control roller 4 is rotatably supported between a pair of second slide blocks via bearings 37 and 37. One second slide block 38 is also slidably fitted into a second fitting groove 22Bb formed at the side plate 22B (the roller frame 25), and then, is fixed by fixing bolts 39 in the fitted state. A hole 38a is formed at the second slide block 38 in a direction in which the second fitting groove 22Bb extends (direction extending to the transfer roller 3). A second compression spring 39 is incorporated in the hole 38a in a compressive state, so that the slide block 38 presses the charging control roller 4 against the transfer roller 3 all the time. In this manner, the cleaning roller 2, the transfer roller 3, and the charging control roller 4 are incorporated with respect to the roller frame 25 in the roller unit 16 with reference to the rotary shaft of the transfer roller 3.

Figure 10:
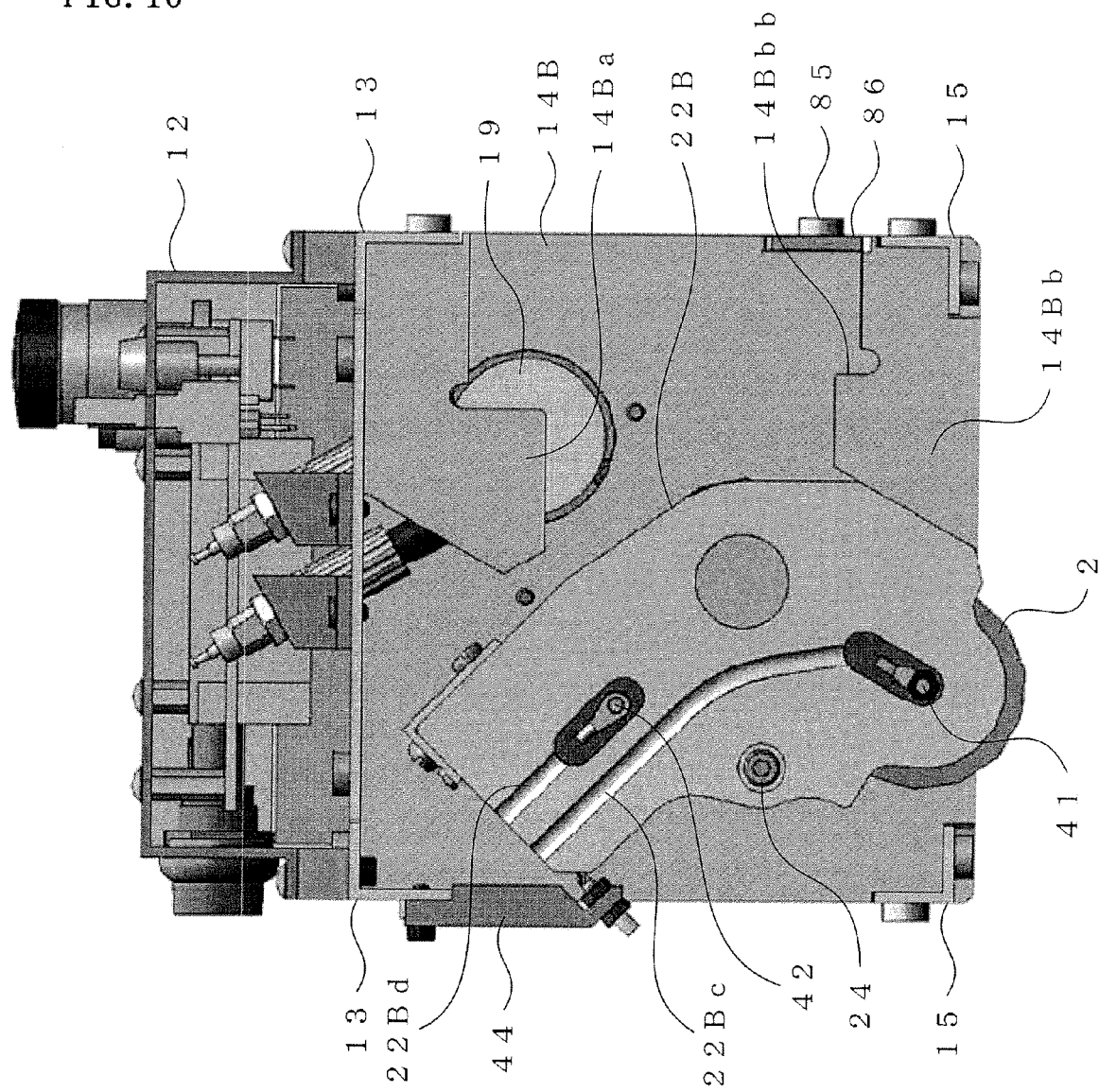
FIG. 10 is a cross-sectional view showing the roller unit incorporated in the frame unit.

As shown in FIG. 10, outside of the side plate 22B, roller electrodes 41 and 42 are disposed at the respective ends of the rotary shafts of the cleaning roller 2 and the charging control roller 4, and further, electric wire containing grooves 22Bc and 22Bd are provided for containing electric wires (not shown) connected to the roller electrodes 41 and 42, respectively. The electric wires are contained inside of the electric wire containing grooves 22Bc and 22Bd, so that the electric wires cannot interfere or inhibit the movement even during rotational movement in incorporating the roller unit 16 in the frame unit 11. Outside of the side plate 22A, the roller electrode 42 is disposed and an electric wire containing groove 22Ad is formed.

Figure 11:
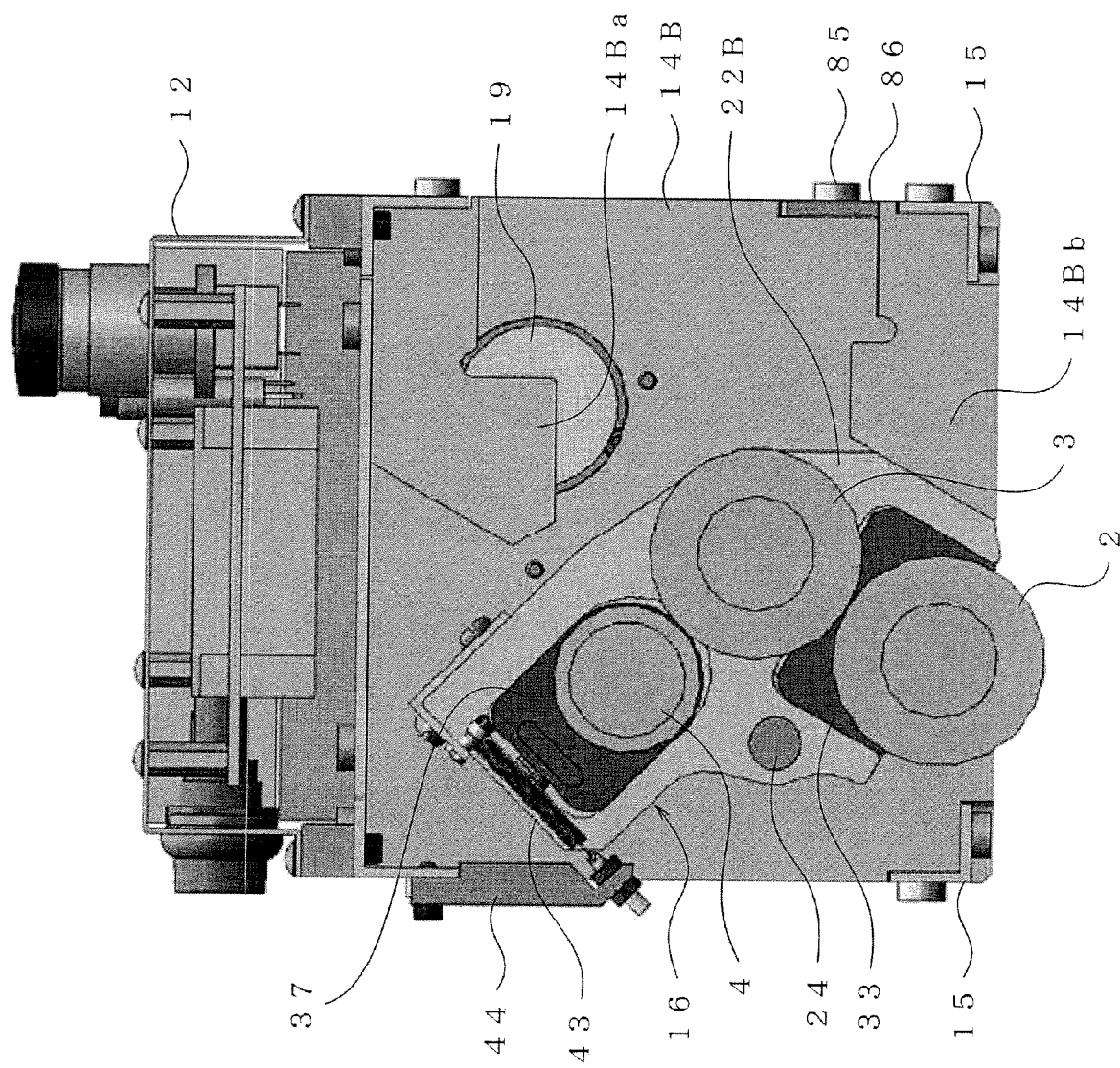
FIG. 11 is a cross-sectional view showing the roller unit incorporated in the frame unit, as viewed at another position.
Figure 12:
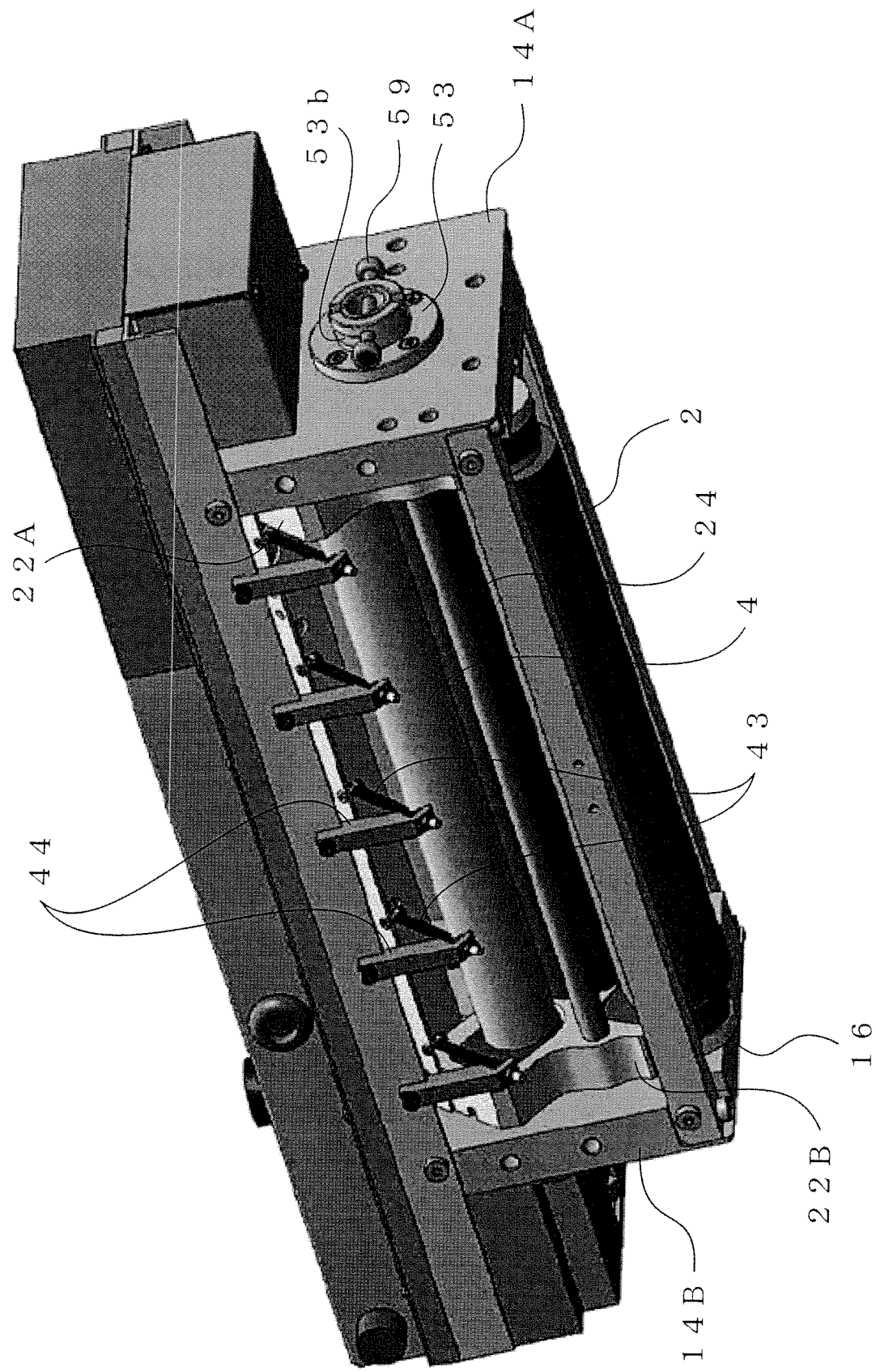
FIG. 12 is a perspective view showing the roller unit incorporated in the frame unit.

In this case, as shown in FIGS. 11 and 12, upper and lower projections 14Aa, 14Ba, 14Bb, and 14Bb each for positioning are formed inside of the side plate 14B. When the lower portion of the side plate 22B of the roller unit 16 is brought into contact with the end surface of the lower projection 14b, the roller unit 16 is designed to be positioned. The roller unit 16 is urged against the end surface of the lower projection 14b by a coil spring 43 interposed between the same and the frame unit 11 (a bracket 44). This urging force also serves as force for pressing the cleaning roller 2 against the surface of a member to be cleaned S. Clearances defined between the upper and lower projections 14Aa, 14Ba, 14Bb, and 14Bb serve as a slide guide for guiding the direction of the slide motion of the recovery unit 17 in incorporating the recovery unit 17 in the frame unit 11.

Figure 13:
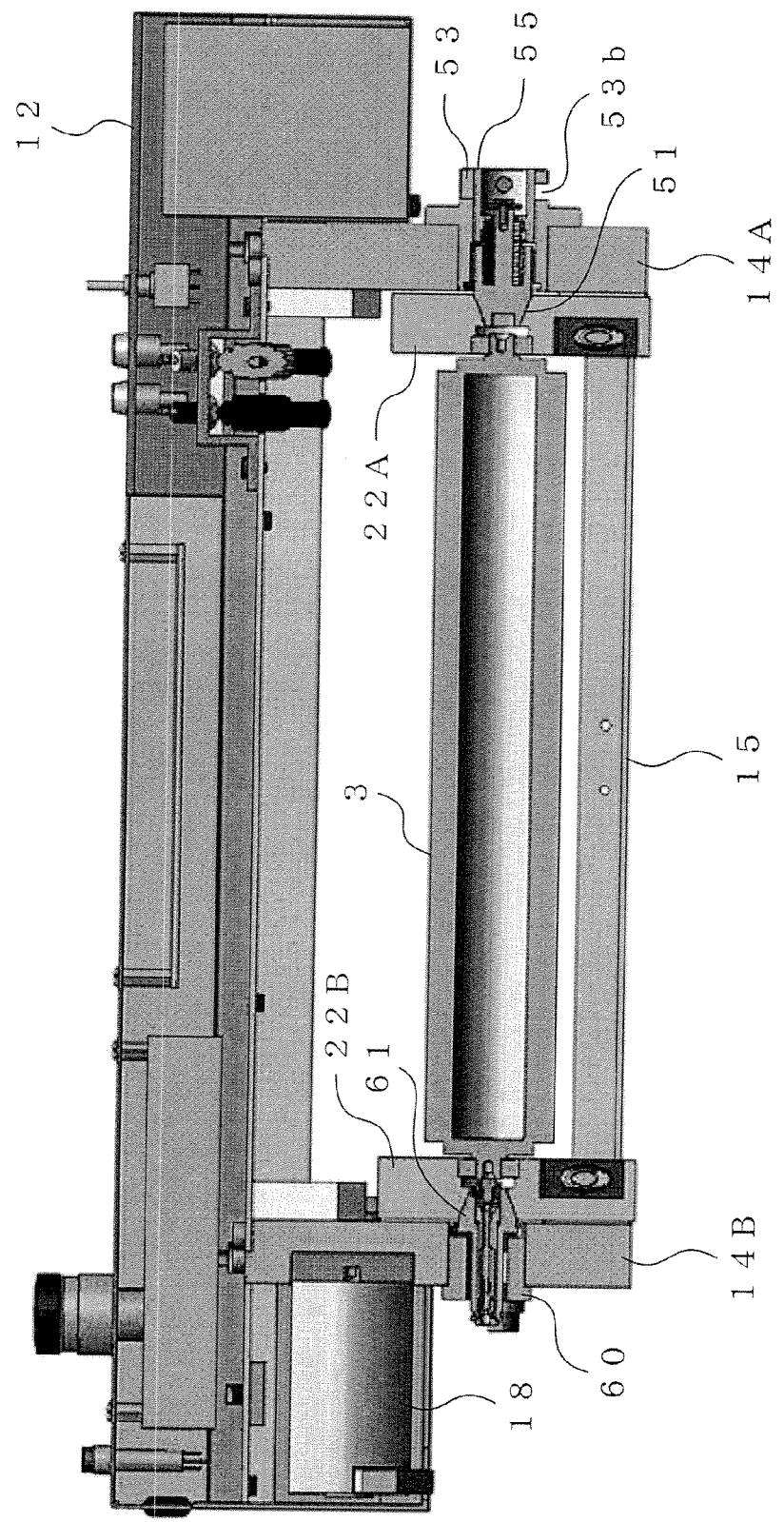
FIG. 13 is a cross-sectional view showing the roller unit incorporated in the frame unit.
Figure 14:
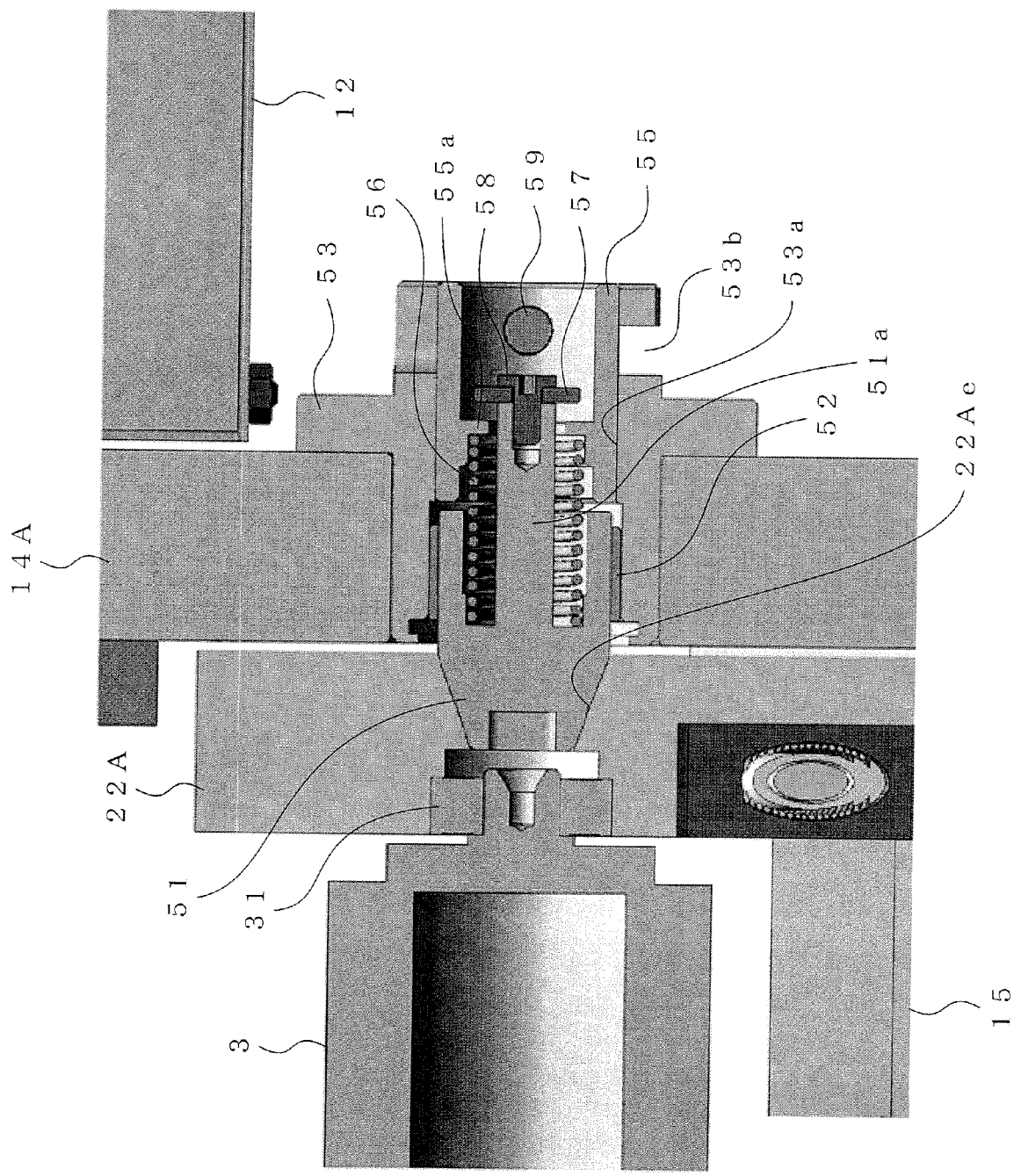
FIG. 14 is a cross-sectional view showing a state in which the roller unit and the frame unit are joined to each other.
Figure 15:
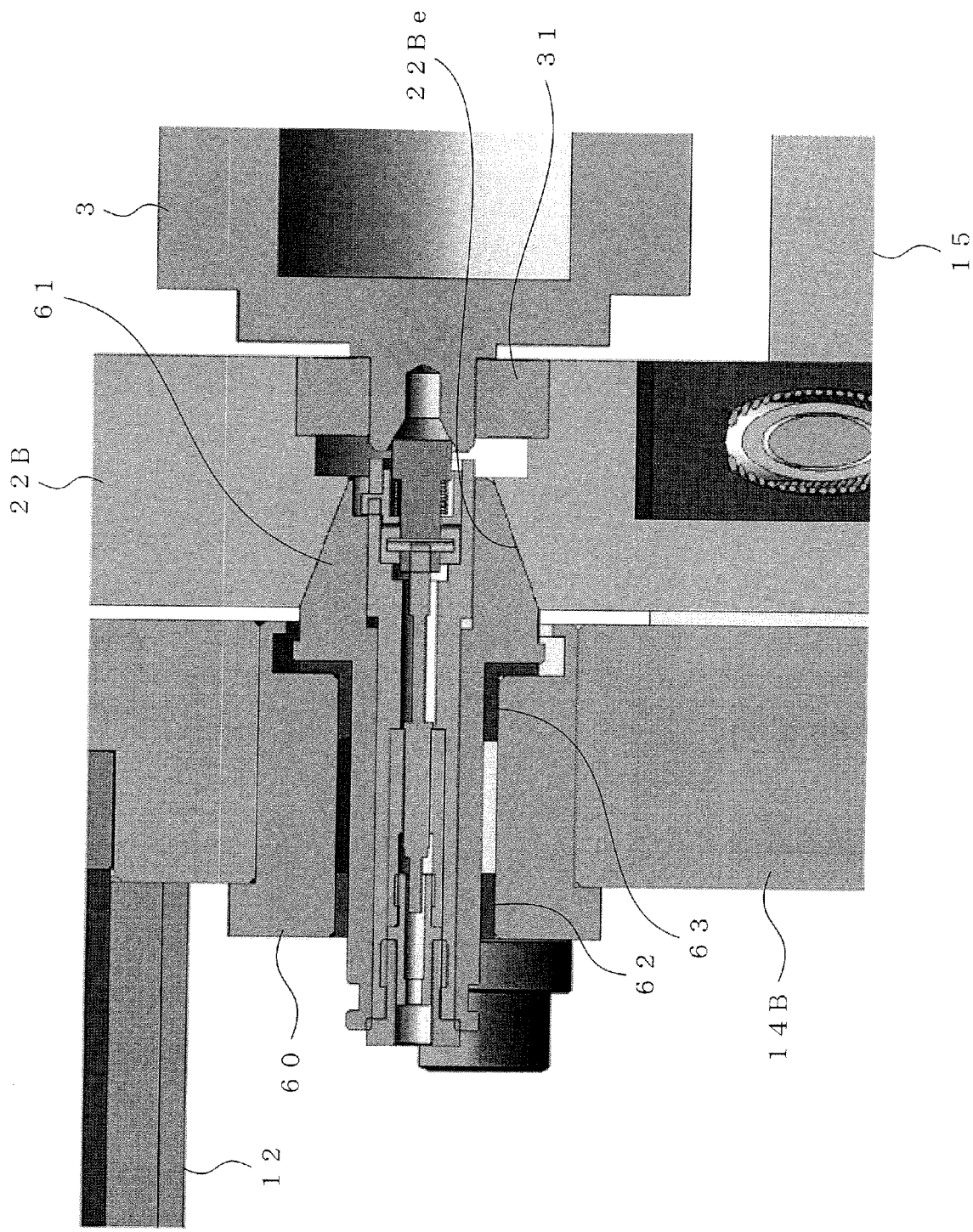
FIG. 15 is another cross-sectional view showing the state in which the roller unit and the frame unit are joined to each other.
Figure 16:
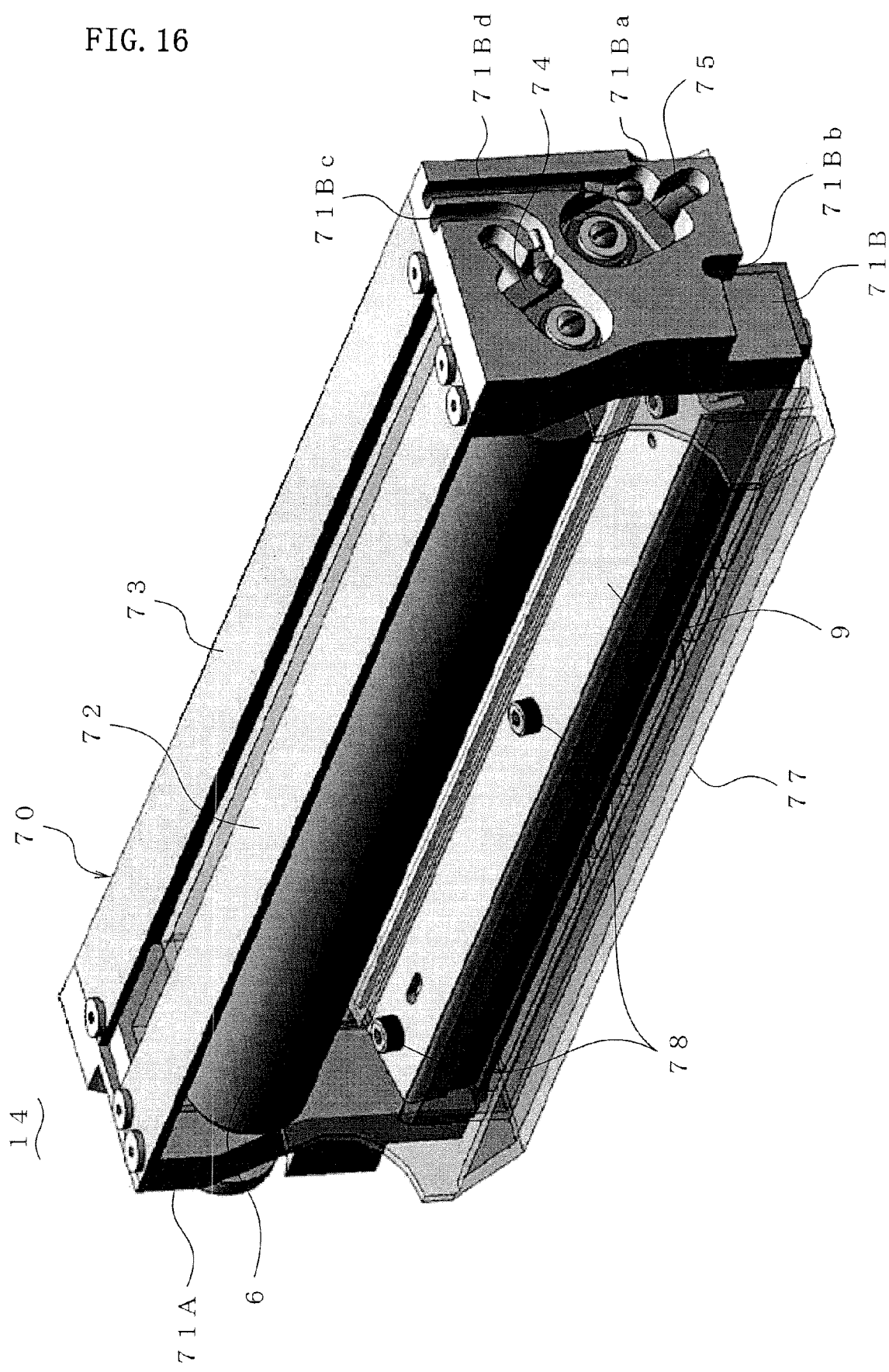
FIG. 16 is a perspective view showing a recovery unit.
Figure 17:
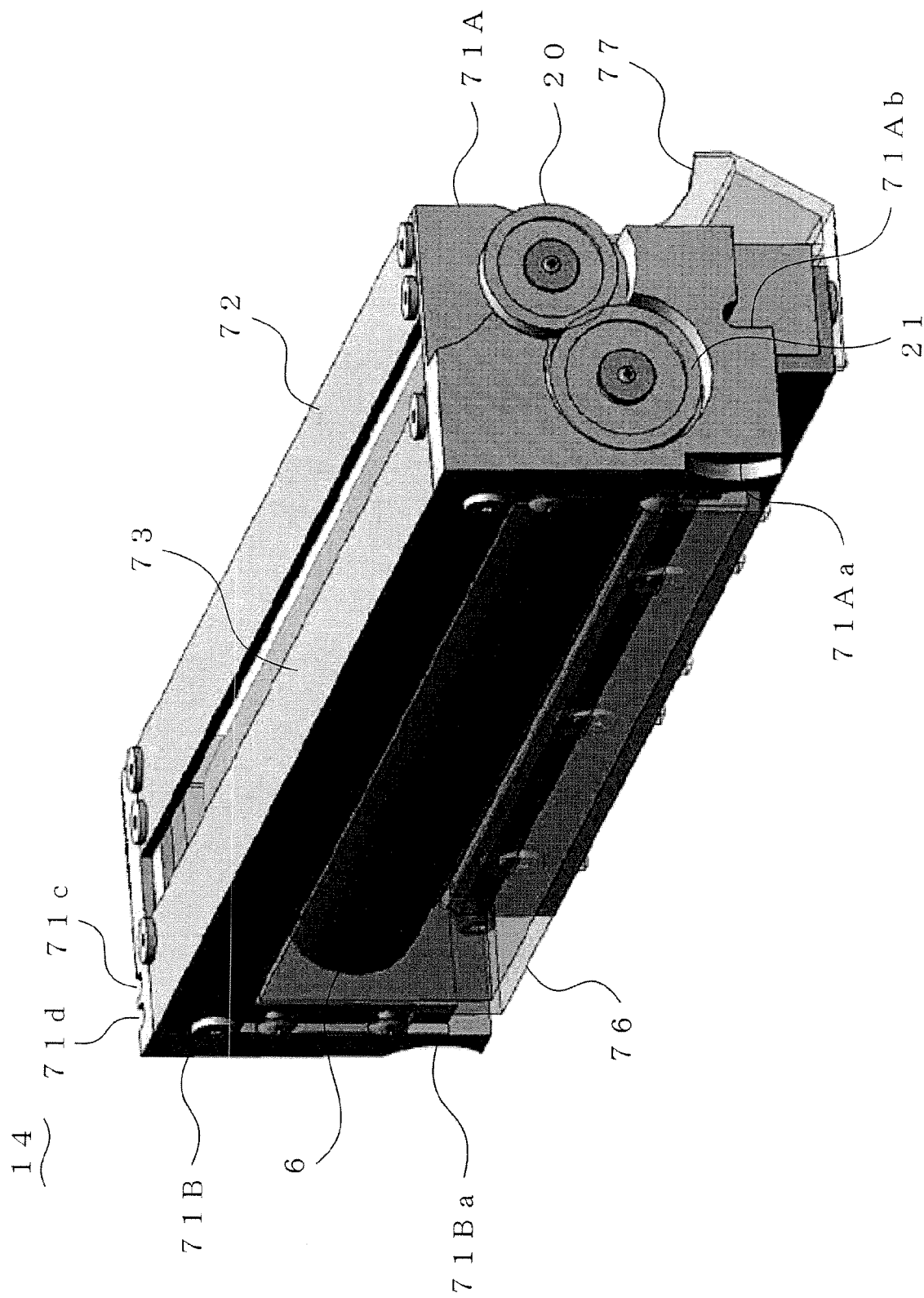
FIG. 17 is another perspective view showing the recovery unit.

As shown in FIGS. 13 to 15, the tapered holes 22Ae and 22Be are formed outside of the side plates 22A and 22B in the roller unit 16: meanwhile, the tapered shafts 51 and 61 projecting toward the center are disposed in the side plates 14A and 14B for the frame unit 11 in such a manner as to freely advance or retract. Thus, the tapered shafts 51 and 61 are detachably fitted to the tapered holes 22Ae and 22Be in a tapered manner, so that the roller unit 16 is secured to the frame unit 11.

As shown in FIG. 14, a cylindrical housing 53 is fixed via four bolts 54 in a penetrated manner in the side plate 14A. The tapered shaft 51 is supported at the center of the housing 53 via a slide bearing 52 in such a manner as to be slidably and rotatably moved in an axial direction. Moreover, a cylindrical spring seat 55 is fitted outside of the housing 53.

The tapered shaft 51 is fitted at the tip thereof to the tapered hole 22Ae formed at the side plate 22A in a tapered manner. Moreover, a compression spring 56 is interposed in a compressive state between the spring seat 55 (an inside flange 55a) and the tapered shaft 51. A washer 57 functioning as a stopper is secured at the end of a center shaft 51a of the tapered shaft 51 penetrating the inside flange 55a via a bolt 58 by the resilience of the compression spring 56 in such a manner as to prevent the tapered shaft 51 from projecting from the side plate 14A. The spring seat 55 is loosely, or rotatably fitted to a hole 53a formed at the housing 53 with a clearance defined therebetween. Additionally, a handle 59 is locked to a groove 53b formed at the housing 53 with rotation of 90 degrees, so that the compression spring 56 is compressed while being fixed at that position.

As shown in FIG. 15, a cylindrical housing 60 is fixed to the side plate 14B via bolts (not shown). The tapered shaft 61 is rotatably supported by the housing 60 via a slide bearing 62 and a flanged slide bearing 63, and further, can receive a thrust force. The tip of the tapered shaft 61 is fitted to a tapered hole 22Be formed at the side plate 22B in a tapered manner.

As shown in FIGS. 16 to 19, a recovery frame 70 for the recovery unit 17 is also configured by connecting two side plates 71A and 71B to each other via a reinforcing bar 72 and a reinforcing angle 73. In the side plate 71B, electrodes 74 and 75 are disposed in such a manner as to be exposed through their opening portions, and further, electric wire containing grooves 71Bc and 71Bd for containing therein electric wires to be connected to the electrodes 74 and 75, respectively, are formed, thereby smoothly incorporating and de-incorporating the recovery unit 17 without any interference of the electric wire. Foreign matter containing boxes 76 and 77 for containing removed foreign matter therein are disposed with respect to the cleaning brush 6 and the metallic roller 7, respectively. Here, fitting recesses 71Aa and 71Ba, to which a fixed washer 86, described later, is detachably fitted, are formed in the side plates 71A and 71B.

Figure 18:
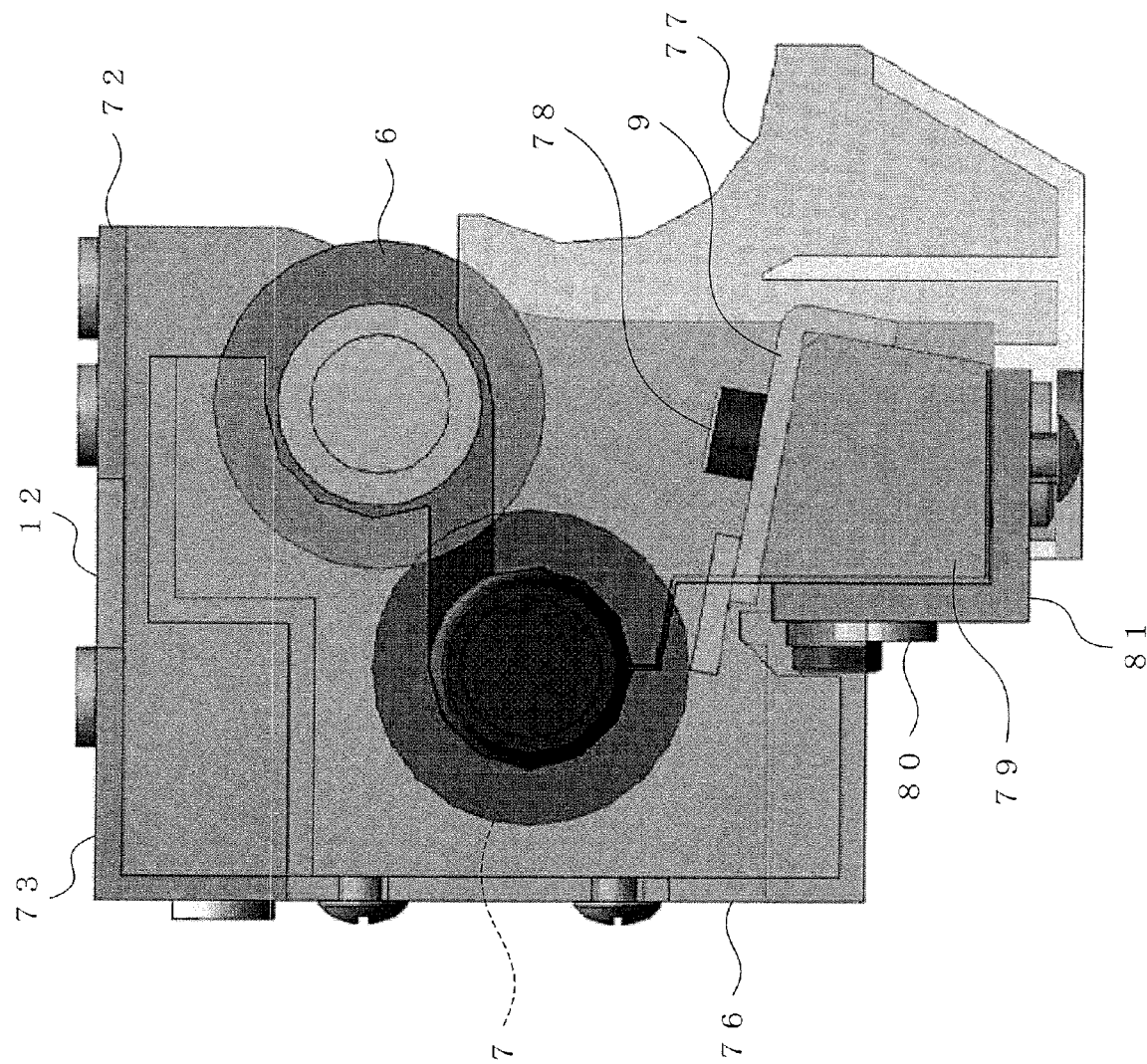
FIG. 18 is a cross-sectional view showing the recovery unit.
Figure 19:
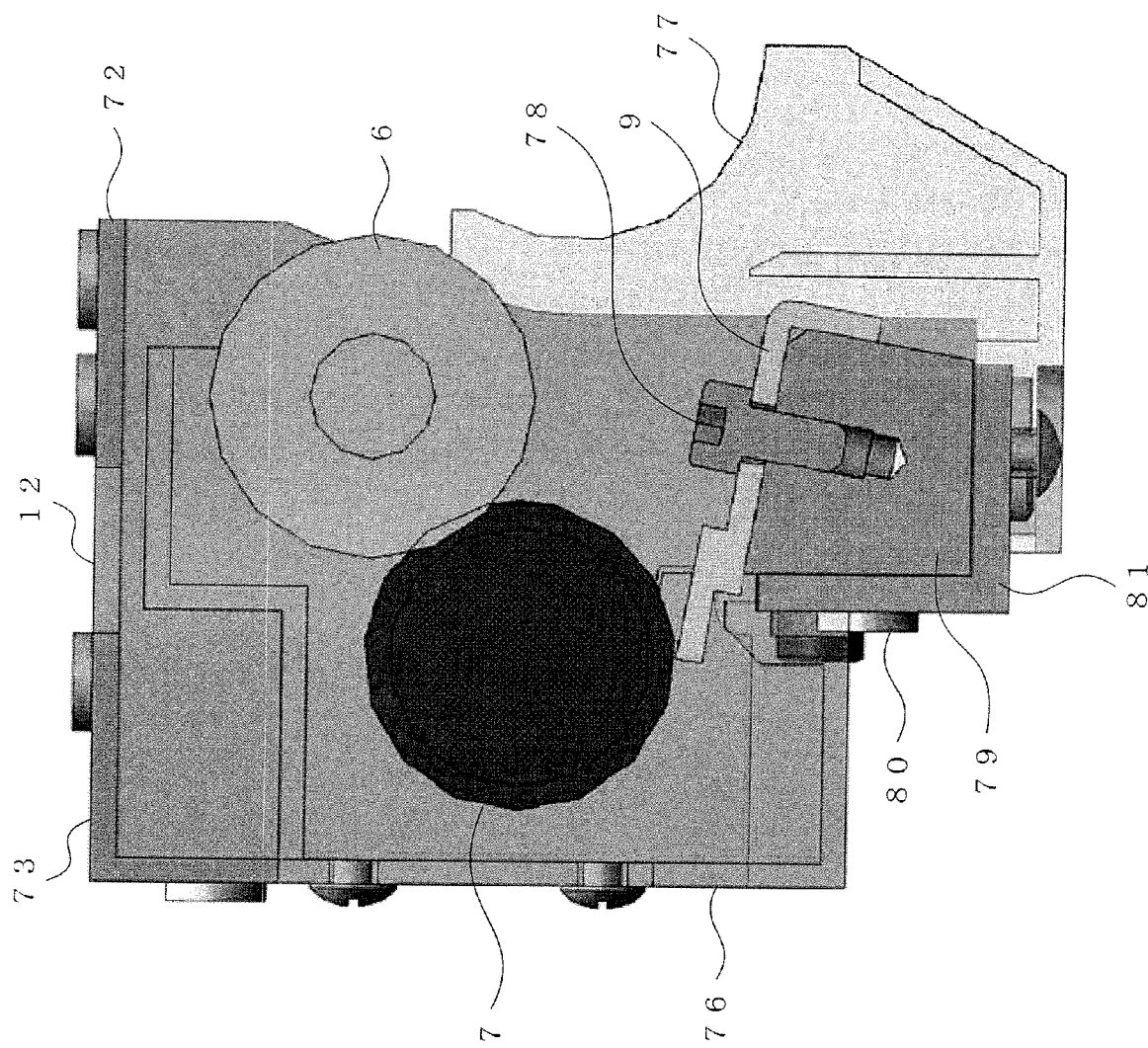
FIG. 19 is another cross-sectional view showing the recovery unit.

As shown in FIGS. 18 and 19, the cleaning blade 9 is fixed to a blade holder 79 via a bolt 78. A contact pressure generated between the blade 9 and the metallic roller 7 can be adjusted by loosening a holder fixing bolt 80 so as to hold a shim between a reinforcing angle 81 and the blade holder 79. Incidentally, a female screw may be disposed in the reinforcing angle 81 such that the blade holder may be lifted up via a bolt or the like.

Figure 20:
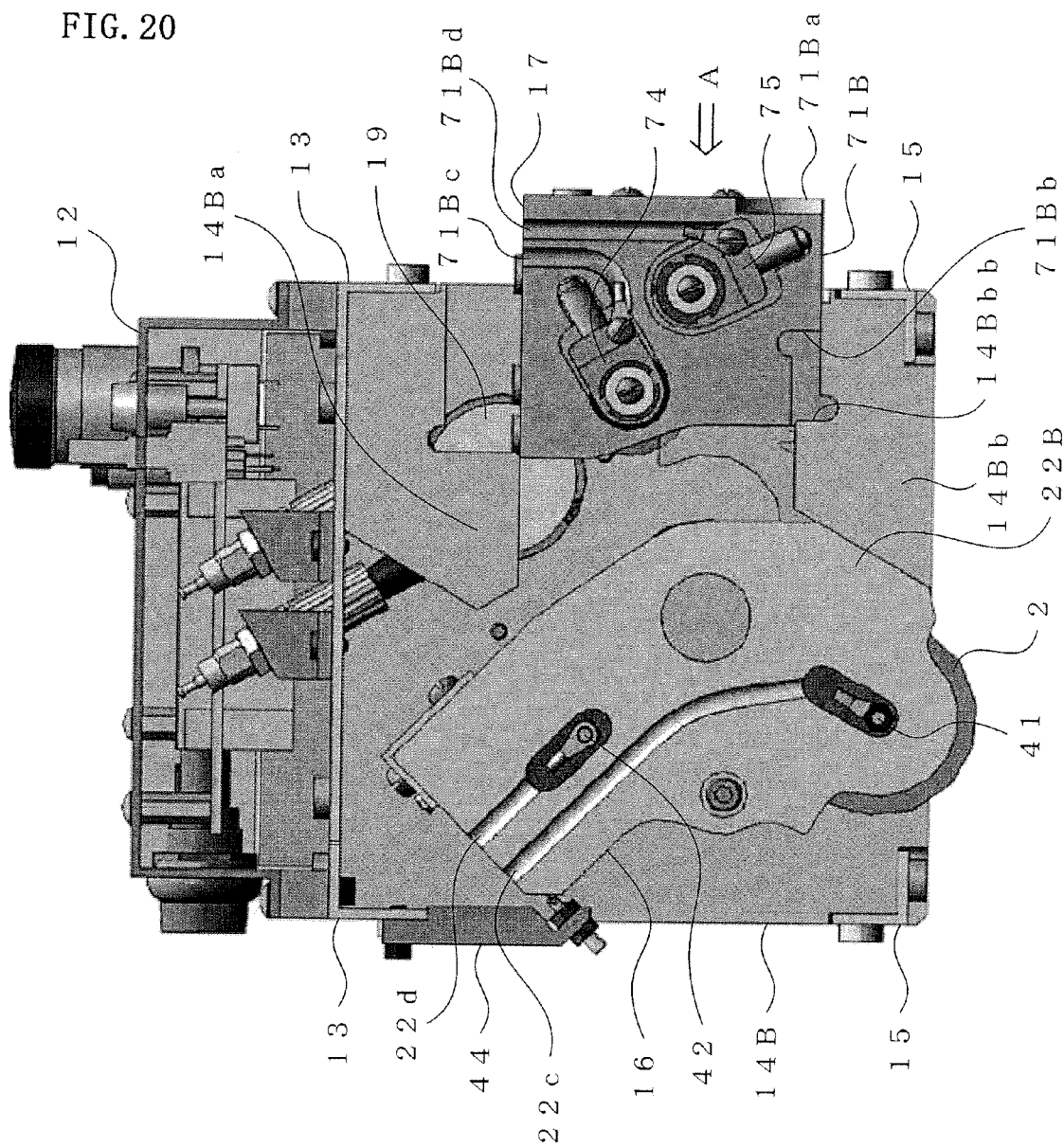
FIG. 20 is an explanatory view of procedures for incorporating the recovery unit into the frame unit.
Figure 21:
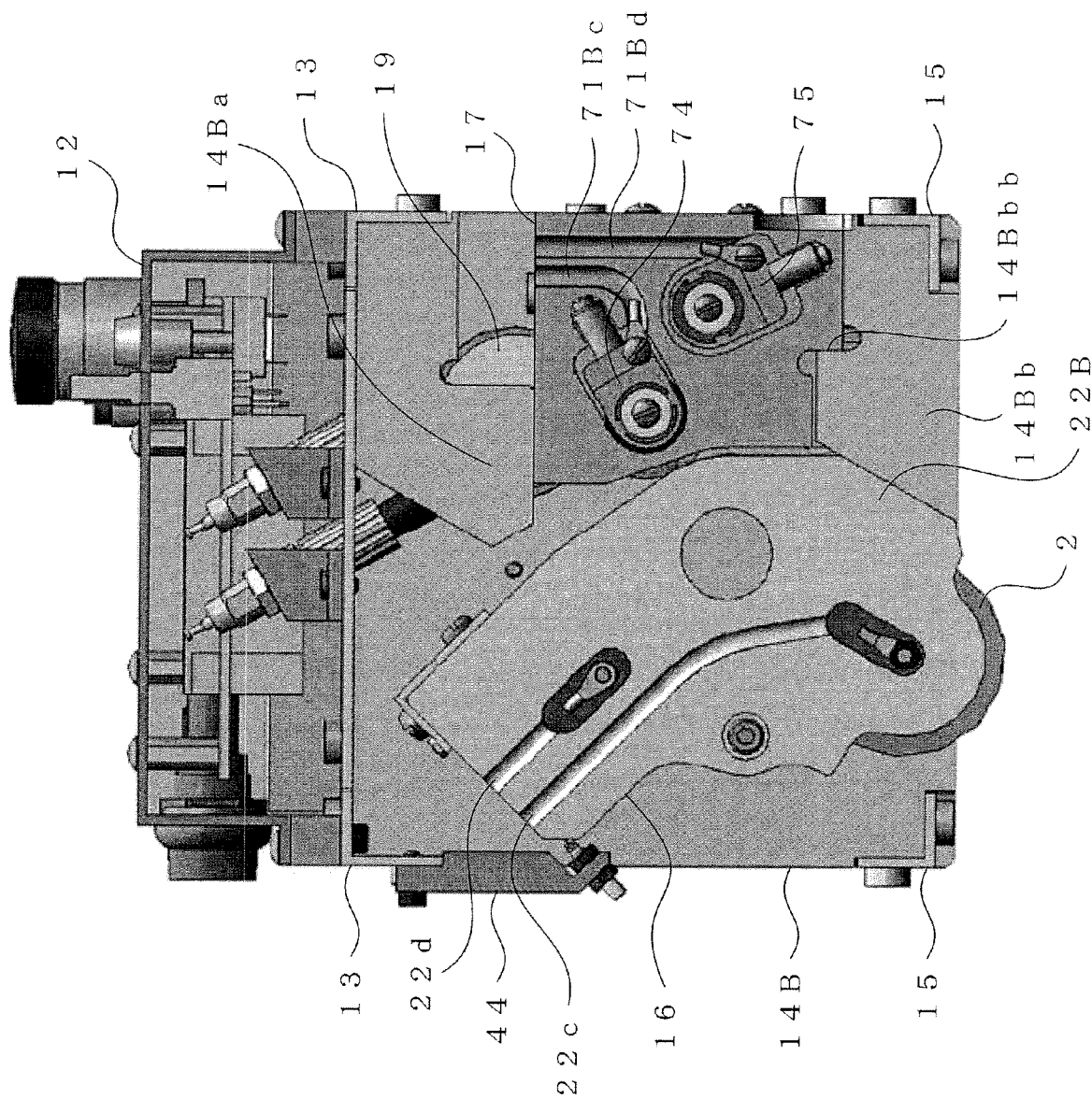
FIG. 21 is another explanatory view of the procedures for incorporating the recovery unit into the frame unit.

When the recovery unit 17 is incorporated in the frame unit 11, the recovery unit 17 is moved in a direction indicated by an arrow A along between the upper and lower projections 14Aa, 14Ba, 14Bb, and 14Bb, as shown in FIGS. 20 and 21. The ends 71Ab and 71Bb are brought into contact with a positioning surface 14Bbb of each of the lower projections 14Ab and 14Bb, so that the side plates 71A and 71B are positioned.

Moreover, the disk-like fixed washer 86 having a partly cut straight portion 86a is rotatably fixed in the side plates 14A and 14B of the frame unit 11. The position of the straight portion 86a of the fixed washer 86 allows or prohibits the recovery unit 17 to be incorporated or de-incorporated. Here, the fixed washer 86 is restricted from being rotated by the fixing bolt 85.

Figure 22:
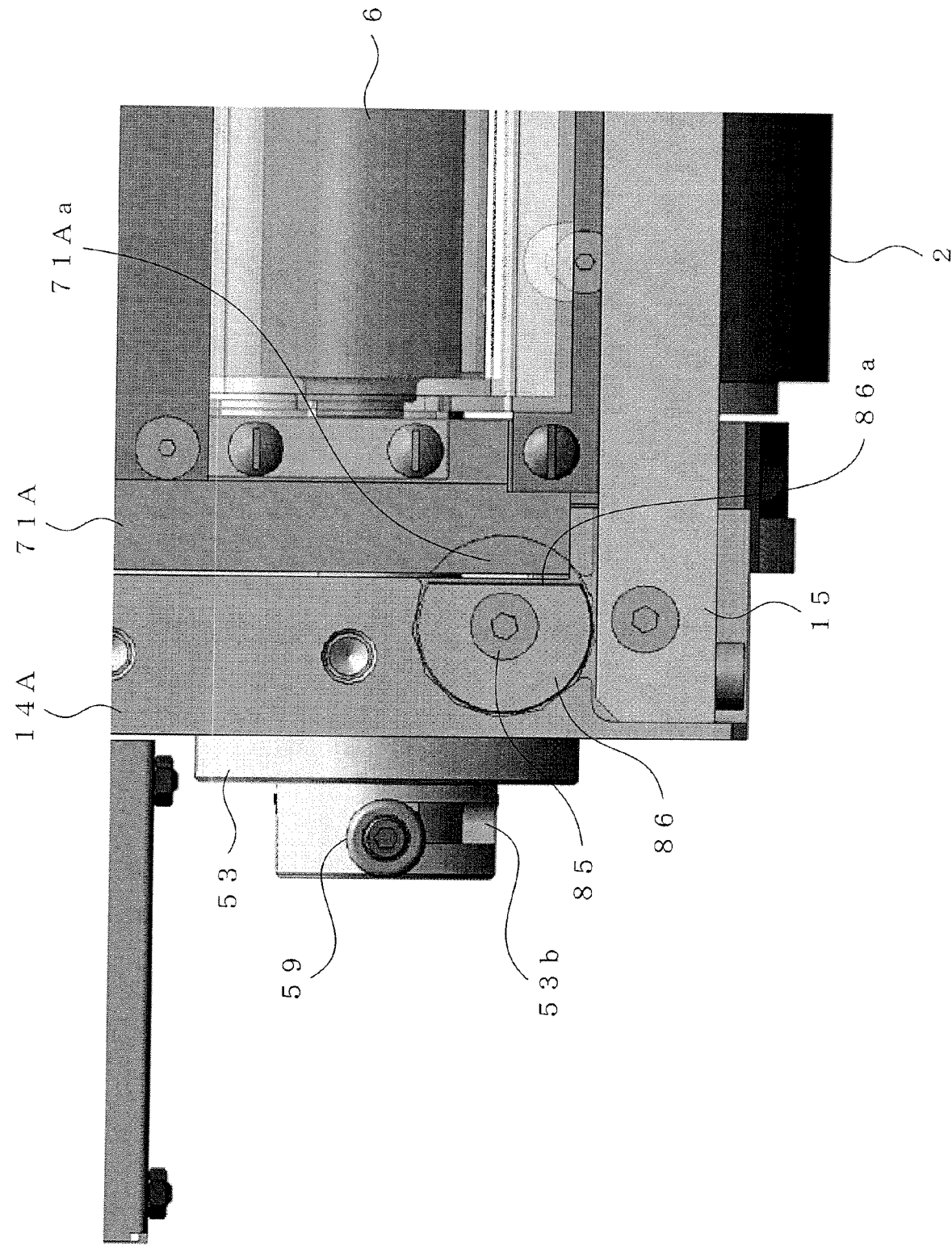
FIG. 22 is still another explanatory view of the procedures for incorporating the recovery unit into the frame unit.
Figure 23:
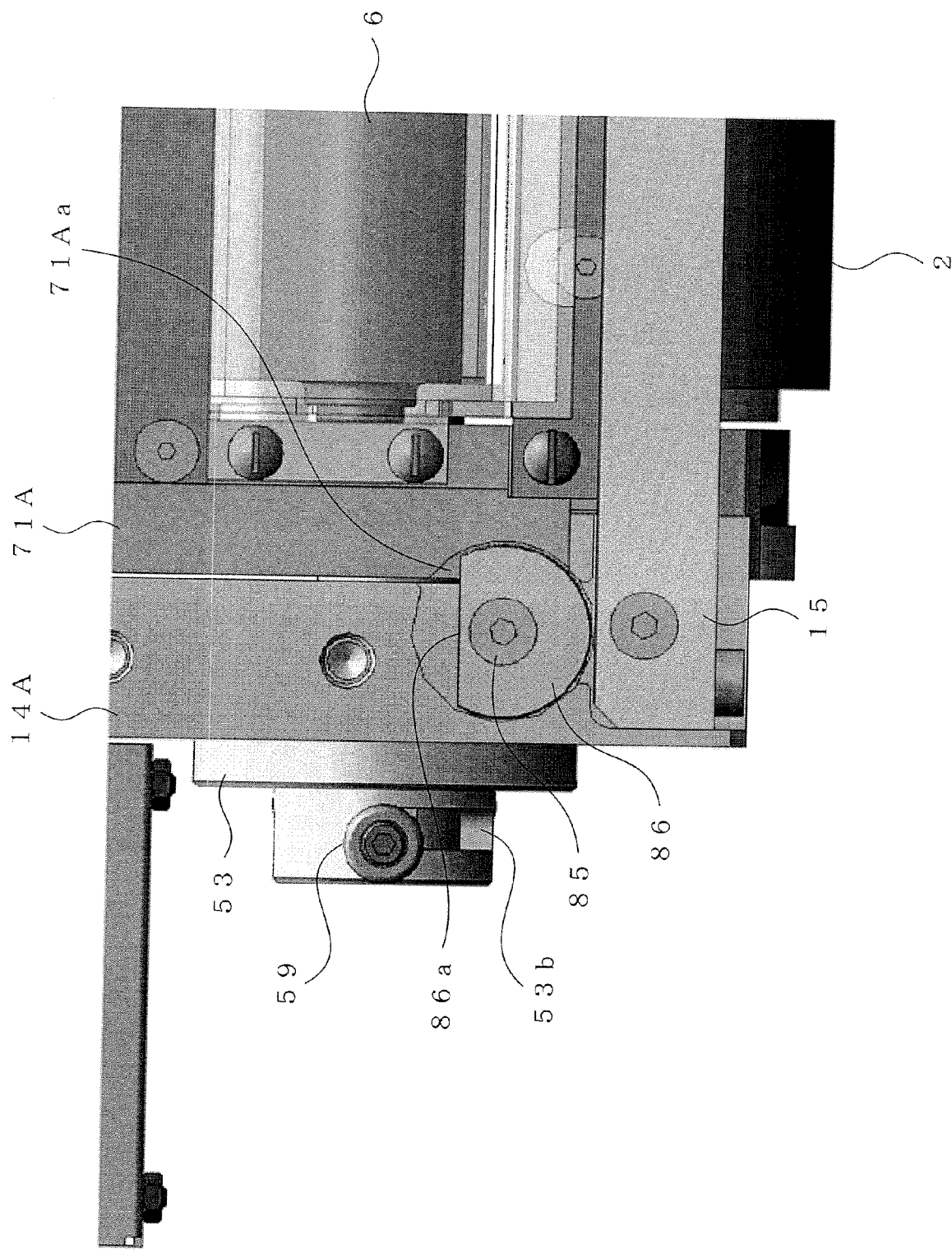
FIG. 23 is yet another explanatory view of the procedures for incorporating the recovery unit into the frame unit.

Specifically, when the recovery unit 17 is incorporated or de-incorporated, the fixing bolt 85 is loosened so that the side plates 14A and 14B in the frame unit 11 are perpendicular to the straight portion 86a of the fixed washer 86, and then, the fixing bolt 85 is tightened so that the recovery unit 17 is fixed, as shown in FIG. 22 (a first position). In this state, the straight portion 86a mates with a side edge extending in a vertical direction of the side plates 14A and 14B, and therefore, the fixed washer 86 cannot project from the side plates 14A and 14B, thereby incorporating or de-incorporating the recovery unit 17. Meanwhile, when the recovery unit 17 is fixed, the fixing bolt 85 is loosened so that the straight portion 86a of the fixed washer 86 is oriented in a horizontal direction, and then, the fixing bolt 85 is tightened so that the recovery unit 17 is fixed, as shown in FIG. 23 (a second position). In this state, a part of the fixed washer 86 projects from the side plates 14A and 14B, thereby prohibiting the recovery unit 17 from being incorporated or de-incorporated.

DESCRIPTION OF REFERENCE SIGNS

1: Cleaning device
2: Cleaning roller
3: Transfer roller
4: Charging control roller
6: Cleaning brush
7: Metallic roller
9: Cleaning blade
11: Frame unit
14A, 14B: Side plate
14Aa, 14Ba: Upper projection
14Ab, 14Bb: Lower projection
14Bbb: Positioning surface
16: Roller unit
17: Recovery unit
22A, 22B: Side plate
22Ba: First fitting groove
22Bb: Second fitting groove
22Bc: Electric wire containing groove
22Ad, 22Bd: Electric wire containing groove
22Ae, 22Be: Tapered hole
33: First slide block
38: Second slide block
41, 42: Roller electrode
43: Coil spring (spring member)
51, 61: Tapered shaft
70: Recovery frame
71A, 71B: Side plate
71Bc, 71Bd: Electric wire containing groove
74, 75: Electrode
76, 77: Foreign matter containing box
86: Fixed washer

The invention claimed is:
1. A cleaning device comprising:
a cleaning roller that is rotated in contact with a surface of a member to be cleaned while being relatively moved;

a transfer roller that is rotated in contact with the surface of the cleaning roller; and a charging control roller that is rotated in contact with the surface of the transfer roller;

the cleaning device, by electric charges to be electrically charged to the charging control roller, changing electric charges for adsorbing foreign matter adhering onto the surface of the member to be cleaned by an electrostatic force with respect to the cleaning roller and the transfer roller, removing the foreign matter such as dust adhering onto the surface of the member to be cleaned by the use of the cleaning roller by utilizing the electrostatic force, and removing the foreign matter adhering onto the cleaning roller by the use of the transfer roller, wherein a recovery unit for removing and recovering the foreign matter adhering onto the transfer roller is detachably attached to a frame unit including the cleaning roller, the transfer roller, and the charging control roller, the recovery unit including a cleaning brush for removing the foreign matter adhering onto the transfer roller, a metallic roller for removing the foreign matter from the cleaning brush, and a cleaning blade for scraping the foreign matter adhering onto the surface of the metallic roller in a predetermined positional relationship with a recovery frame in a state in which the recovery unit is attached to the frame unit; and wherein the cleaning brush is located at a position where it can be rotated in contact with the surface of the transfer roller; the metallic roller is located at a position where it can be rotated in contact with the cleaning brush; and the cleaning blade is fixed at a position in contact with the surface of the metallic roller; the cleaning brush, the metallic roller, the cleaning blade being fixed to the recovery frame.

2. A cleaning device according to claim 1, wherein
the recovery unit includes a foreign matter containing box, in which the foreign matter scraped by the cleaning brush and the cleaning blade is contained, in the recovery frame.

3. A cleaning device according to claim 2, wherein
the frame unit is provided with a fixed washer capable of locking the recovery unit with respect to the frame unit,
the fixed washer selectively taking a first position where the recovery unit can be detachably attached to the frame unit and a second position where the recovery unit is prohibited from being detachably attached to the frame unit but is locked to the frame unit.

4. A cleaning device according to claim 3, wherein
the cleaning roller, the transfer roller, and the charging control roller are rotatably supported by a roller frame, thus configuring a roller unit,
the roller unit being detachably attached to the frame unit.

5. A cleaning device according to claim 2, wherein
the recovery frame is configured to rotatably support the cleaning brush and the metallic roller between right and left side plates,
the metallic roller and the cleaning brush are provided at the ends of rotary shafts thereof with electrodes exposed outside of the side plates of the recovery frame, and
a containing groove that contains therein an electric wire to be connected to the electrode is formed at an outside surface of the side plate of the recovery frame.

6. A cleaning device according to claim 2, wherein
the cleaning roller, the transfer roller, and the charging control roller are rotatably supported by a roller frame, thus configuring a roller unit,
the roller unit being detachably attached to the frame unit.

7. A cleaning device according to claim 1, wherein
the recovery frame is configured to rotatably support the cleaning brush and the metallic roller between right and left side plates,
the metallic roller and the cleaning brush are provided at the ends of rotary shafts thereof with electrodes exposed outside of the side plates of the recovery frame, and
a containing groove that contains therein an electric wire to be connected to the electrode is formed at an outside surface of the side plate of the recovery frame.

8. A cleaning device according to claim 7, wherein
the frame unit is provided with a fixed washer capable of locking the recovery unit with respect to the frame unit,
the fixed washer selectively taking a first position where the recovery unit can be detachably attached to the frame unit and a second position where the recovery unit is prohibited from being detachably attached to the frame unit but is locked to the frame unit.

9. A cleaning device according to claim 7, wherein
the cleaning roller, the transfer roller, and the charging control roller are rotatably supported by a roller frame, thus configuring a roller unit,
the roller unit being detachably attached to the frame unit.

10. A cleaning device according to claim 1, wherein
the cleaning roller, the transfer roller, and the charging control roller are rotatably supported by a roller frame, thus configuring a roller unit,
the roller unit being detachably attached to the frame unit.

11. A cleaning device according to claim 10, wherein the roller unit is supported by the frame unit at a position where the cleaning brush can be rotated in contact with the surface of the transfer roller; and
in the roller unit, the charging control roller and the cleaning roller are located at positions where they can be rotated in contact with the surface of the transfer roller, and further, the roller unit is incorporated at a position where the roller unit can be turned on a position coaxial with the center of the rotary shaft of the transfer roller.

12. A cleaning device according to claim 11, wherein
the cleaning roller is rotatably supported by a first slide block whereas the charging control roller is rotatably supported by a second slide block,
the roller frame rotatably supports the transfer roller, and further, has first and second fitting grooves, to which the first and second slide blocks are slidably fitted, and
the roller unit is provided with first and second spring members for urging the first and second slide blocks in a direction in which the transfer roller and the charging control roller are pressed against the transfer roller in the state in which the first and second slide blocks are fitted to the first and second fitting grooves.

13. A cleaning device according to claim 11, wherein
a spring member for resiliently urging the roller frame so as to generate a pressing force of the cleaning roller with respect to the member to be cleaned is interposed between the frame unit and the roller frame.

14. A cleaning device according to claim 10, wherein
the cleaning roller is rotatably supported by a first slide block whereas the charging control roller is rotatably supported by a second slide block,
the roller frame rotatably supports the transfer roller, and further, has first and second fitting grooves, to which the first and second slide blocks are slidably fitted, and
the roller unit is provided with first and second spring members for urging the first and second slide blocks in a direction in which the transfer roller and the charging control roller are pressed against the transfer roller in the state in which the first and second slide blocks are fitted to the first and second fitting grooves.

15. A cleaning device according to claim 14, wherein
the roller frame is configured to rotatably support the cleaning roller, the transfer roller, and the metallic charging control roller between the right and left side plates,
a tapered shaft is rotatably and slidably interposed between the right and left side plates, the tip of the tapered shaft being configured to be resiliently urged so as to project toward the center of the frame unit, and
a tapered hole, to which the tapered shaft is fitted, is formed between the right and left side plates in the roller frame.

16. A cleaning device according to claim 14, wherein
the cleaning roller and the charging control roller are provided at the ends of the rotary shafts thereof with roller electrodes exposed outside of the side plate of the roller frame, and
a containing groove that contains therein an electric wire to be connected to the roller electrode is formed at the outside surface of the side plate of the roller frame.

17. A cleaning device according to claim 10, wherein
the roller frame is configured to rotatably support the cleaning roller, the transfer roller, and the metallic charging control roller between the right and left side plates,
a tapered shaft is rotatably and slidably interposed between the right and left side plates, the tip of the tapered shaft being configured to be resiliently urged so as to project toward the center of the frame unit, and
a tapered hole, to which the tapered shaft is fitted, is formed between the right and left side plates in the roller frame.

18. A cleaning device according to claim 17, wherein
the roller frame is configured to rotatably support the cleaning roller, the transfer roller, and the metallic charging control roller between the right and left side plates,
a tapered shaft is rotatably and slidably interposed between the right and left side plates, the tip of the tapered shaft being configured to be resiliently urged so as to project toward the center of the frame unit, and
a tapered hole, to which the tapered shaft is fitted, is formed between the right and left side plates in the roller frame.

19. A cleaning device according to claim 10, wherein
a spring member for resiliently urging the roller frame so as to generate a pressing force of the cleaning roller with respect to the member to be cleaned is interposed between the frame unit and the roller frame.

20. A cleaning device according to claim 10, wherein
the cleaning roller and the charging control roller are provided at the ends of the rotary shafts thereof with roller electrodes exposed outside of the side plate of the roller frame, and
a containing groove that contains therein an electric wire to be connected to the roller electrode is formed at the outside surface of the side plate of the roller frame.

* * * * *